United States Patent
Altunkilic et al.

(10) Patent No.: US 10,211,789 B2
(45) Date of Patent: Feb. 19, 2019

(54) PHEMT COMPONENTS WITH ENHANCED LINEARITY PERFORMANCE

(71) Applicant: SKYWORKS SOLUTIONS, INC., Woburn, MA (US)

(72) Inventors: Fikret Altunkilic, North Andover, MA (US); Haki Cebi, Orlando, FL (US); Yu Zhu, Wellesley, MA (US); Cejun Wei, Burlington, MA (US); Jerod F. Mason, Bedford, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/493,255

(22) Filed: Apr. 21, 2017

(65) Prior Publication Data
US 2017/0310284 A1 Oct. 26, 2017

Related U.S. Application Data

(60) Provisional application No. 62/372,354, filed on Aug. 9, 2016, provisional application No. 62/325,643, filed on Apr. 21, 2016.

(51) Int. Cl.
*H03F 3/16* (2006.01)
*H03F 1/32* (2006.01)
(Continued)

(52) U.S. Cl.
CPC ......... *H03F 1/3205* (2013.01); *H01L 29/778* (2013.01); *H03F 3/193* (2013.01);
(Continued)

(58) Field of Classification Search
CPC ......... H03F 1/3205; H03F 3/193; H03F 3/245
(Continued)

(56) References Cited

U.S. PATENT DOCUMENTS 6,201,455 B1 * 3/2001 Kusunoki ............ H01P 1/15
327/308
6,351,183 B1 * 2/2002 Khabbaz ............ H03F 1/342
330/151
(Continued)

FOREIGN PATENT DOCUMENTS

JP 2014165709 A 9/2014
WO 2014037027 A1 3/2014

OTHER PUBLICATIONS

International Search Report and Written Opinion from corresponding International Application No. PCT/US2017/028714 dated Jul. 27, 2017.

*Primary Examiner* — Khanh V Nguyen
*Assistant Examiner* — Khiem Nguyen
(74) *Attorney, Agent, or Firm* — Lando & Anastasi, LLP

(57) ABSTRACT pHEMT-based circuits and methods of improving the linearity thereof. One example pHEMT circuit includes a pHEMT connected between an input terminal and a load and a non-linear resistance connected to the pHEMT. The pHEMT produces a first harmonic signal at the load responsive to being driven by an input signal of a fundamental frequency received at the input terminal, the first harmonic signal having a first phase. The non-linear resistance has a resistance selected to produce a second harmonic signal at the load having a second phase opposite to the first phase. Methods can include determining a first amplitude and a first phase of a first harmonic signal produced at the load by a pHEMT in an ON state, and tuning the non-linear resistance to produce at the load a second harmonic signal having a second amplitude and a second phase that minimizes a net harmonic signal at the load.

20 Claims, 18 Drawing Sheets

(51) Int. Cl.
*H01L 29/778* (2006.01)
*H03F 3/24* (2006.01)
*H03F 3/193* (2006.01)
*H03K 17/687* (2006.01)

(52) U.S. Cl.
CPC ........... *H03F 3/245* (2013.01); *H03K 17/687* (2013.01); *H03F 2200/228* (2013.01); *H03F 2200/294* (2013.01); *H03F 2200/451* (2013.01)

(58) Field of Classification Search
USPC .................................. 330/51, 251, 277, 311
See application file for complete search history.

(56) References Cited

U.S. PATENT DOCUMENTS

| | | | |
|---|---|---|---|
| 6,642,578 B1 * | 11/2003 | Arnold | H01P 1/15 257/341 |
| 2006/0194558 A1 | 8/2006 | Kelly | |
| 2015/0288412 A1 | 10/2015 | Aalto et al. | |
| 2015/0341126 A1 | 11/2015 | Deng et al. | |

* cited by examiner

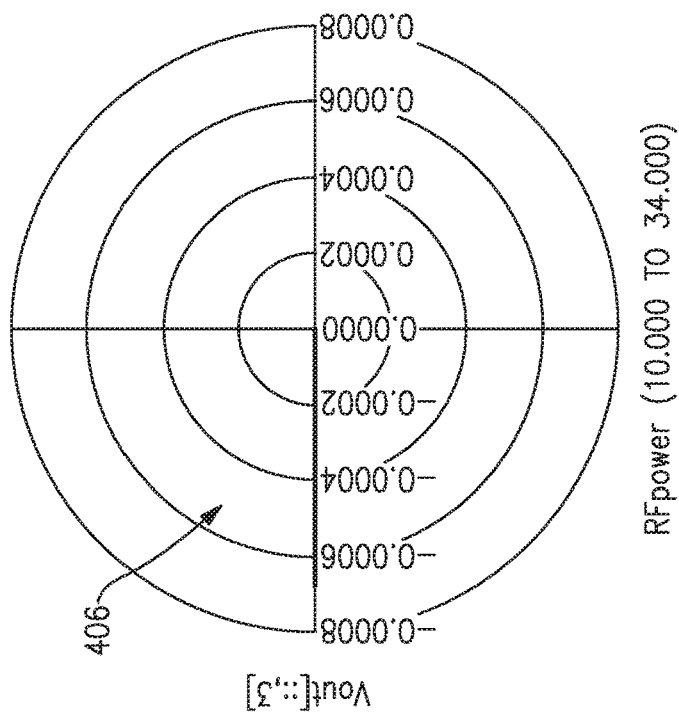
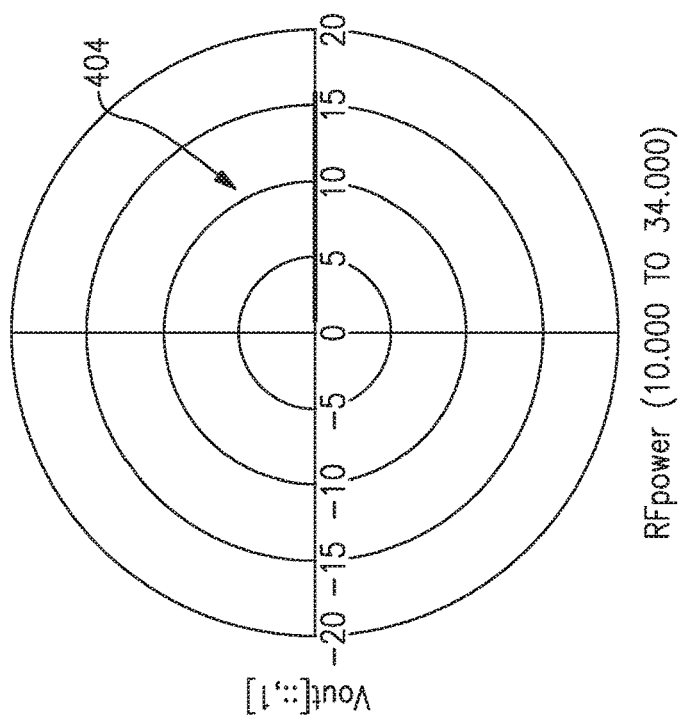

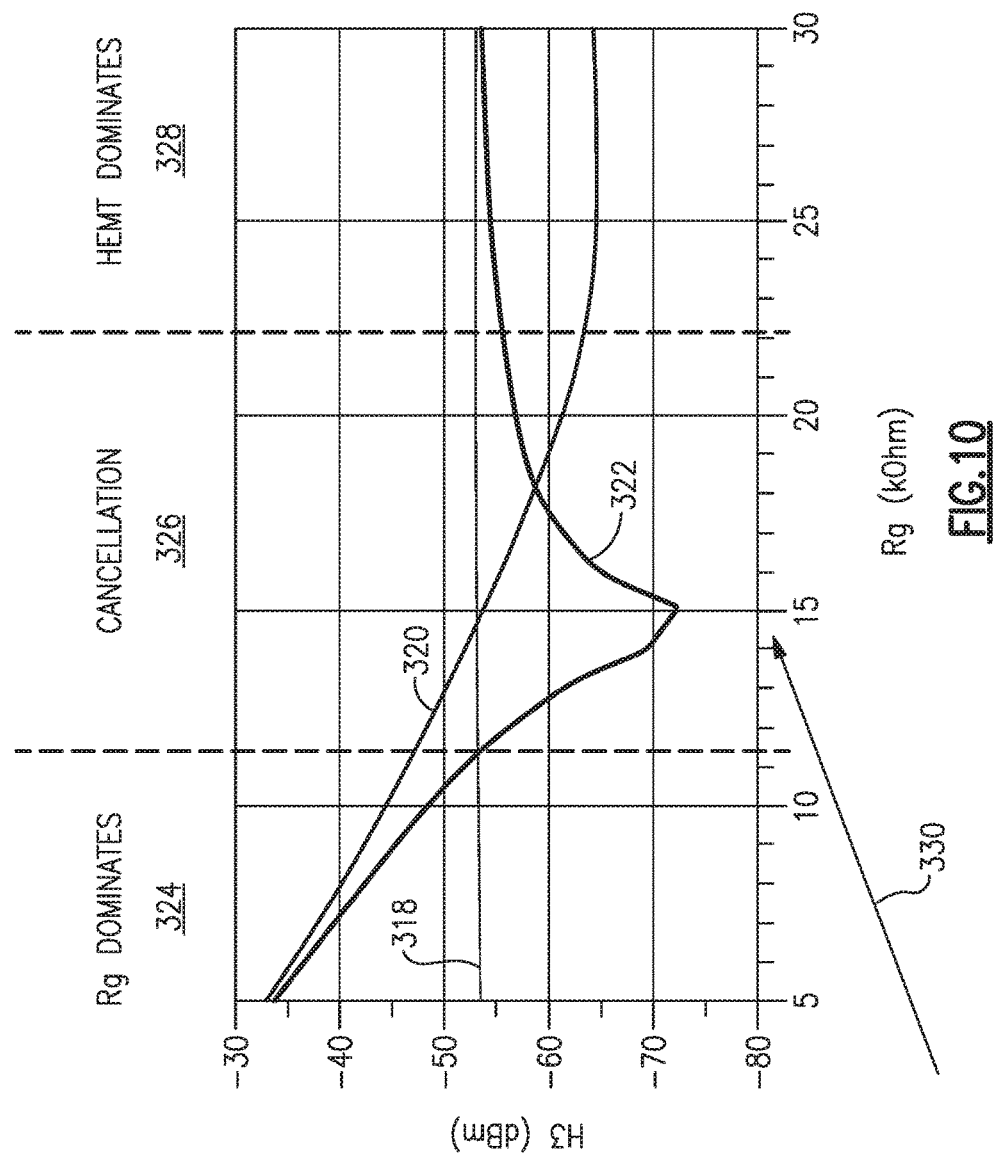

PHEMT COMPONENTS WITH ENHANCED LINEARITY PERFORMANCE

CROSS-REFERENCE TO RELATED APPLICATIONS

This application claims the benefit under 35 U.S.C. § 119(e) of U.S. Provisional Application No. 62/325,643 filed on Apr. 21, 2016, and of U.S. Provisional Application No. 62/372,354 filed on Aug. 9, 2016, each of which is incorporated herein by reference in its entirety for all purposes.

BACKGROUND

Portable communication devices, such as cellular telephones, typically are required to operate over a number of different communication bands. These so called "multi-band" communication devices use one or more instances of transmit and receive circuitry to generate and amplify the transmit signals and amplify the receive signals, respectively. However, these communication devices usually employ a single antenna to both transmit and receive the signals over the various communication bands. Although some systems may include multiple antennas, for example, a high-band antenna and a low/mid-band antenna, at least one of these antennas is still often used to transmit or receive in multiple frequency bands. The antenna in such communication devices is typically connected to the transmit and receive circuitry through switching circuitry, such as a duplexer or a diplexer, or through an isolated switch element, sometimes referred to as a "transmit/receive switch" or an "antenna switch." The switching circuitry or antenna switch must effectively isolate the transmit signal from the receive signal. Isolating the transmit signal from the receive signal becomes more problematic in a multiple band communications device where the transmit frequency (or a harmonic thereof) of one communication band might overlap with the receive frequency of a different communication band.

Various electronic components used in communication devices include transistors used for various purposes, including switching and amplification. In modern wireless communication devices, linearity and physical size of transistor-based components, including the antenna switching circuitry and low noise amplifiers, for example, are significant design factors. Linearity is usually defined by what is referred to as a third order intermodulation distortion (IMD3). The IMD3 signal may deteriorate the sensitivity of the receiver if the antenna switch or switching circuitry allows a sufficiently high IMD3 signal through. Furthermore, IMD3 performance in the low noise amplifier(s) can also be critical to the sensitivity and overall performance of the receiver.

Conventional approaches to improving IMD3 performance in transistor-based components include increasing the bias current or voltage, increasing the size of the transistors (with an associated increase in the component die size), changing the circuit topology, and using advanced process technology in the fabrication of the devices. However, these approaches have associated drawbacks. For example, as noted above, it is often desirable to minimize the size and power requirements of mobile communication devices, and therefore increasing the die size of components or the bias current/voltage is not necessarily a preferred approach. Similarly, requiring the use of specialized or advanced process techniques can increase the cost of the devices.

SUMMARY OF THE INVENTION

There is a need for a method by which to improve IMD3 performance in components such as switches, amplifiers, and others, without increasing bias current/voltage or device size, and while allowing the use of standard manufacturing processes.

Aspects and embodiments are directed to transistor-based electronic components, such as switches and amplifiers, having improved linearity, to circuits, modules and devices containing such components, and to techniques for achieving the improved linearity through cancellation of harmonics, particular IMD3 signals, produced in the components during operation.

According to one embodiment a pseudomorphic high electron mobility transistor (pHEMT) switching circuit comprises at least one pHEMT connected in series between an input signal terminal and a load, the at least one pHEMT configured to produce a first harmonic signal at the load responsive to being driven by an input signal of a fundamental frequency received at the input signal terminal, the first harmonic signal having a first phase, and at least one gate resistor connected to a gate of the at least one pHEMT and having a resistance value selected to produce a second harmonic signal at the load, the second harmonic signal having a second phase opposite to the first phase.

In one example the at least one pHEMT includes at least one single-gate pHEMT. In another example the at least one pHEMT includes at least one triple-gate pHEMT.

In one example the at least one gate resistor includes at least one variable resistor. The pHEMT switching circuit may further comprise a controller connected to the at least one variable resistor and configured to tune a resistance of the at least one variable resistor to provide the resistance value at the gate of the at least of pHEMT, the resistance value being selected such that the second harmonic signal substantially cancels the first harmonic signal at the load. In one example a net harmonic signal at the load resulting from cancellation of the first harmonic signal by the second harmonic signal has a power level of less than −50 dBm.

In another example the at least one gate resistor includes a plurality of switchable resistors configured to be selectively connected together to provide the resistance value at the gate of the at least one pHEMT. The pHEMT switching circuit may further comprise a controller coupled to the plurality of switchable resistors and configured to provide at least one control signal to actuate switches associated with selected ones of the plurality of switchable resistors to connect together the selected ones of the plurality of switchable resistors to provide the resistance value at the gate of the at least one pHEMT, the resistance value being selected such that the second harmonic signal substantially cancels the first harmonic signal at the load. In one example a net harmonic signal at the load resulting from cancellation of the first harmonic signal by the second harmonic signal has a power level of less than −50 dBm.

Another embodiment is directed to a module comprising an example of the above-discussed pHEMT switching circuit.

Another embodiment is directed to a wireless device comprising an antenna, a transceiver configured to produce a transmit signal, and a module including an example of the above-discussed pHEMT switching circuit. The module is connected between the antenna as the load and the transceiver. The module further includes filter circuitry coupled to the pHEMT switching circuit, and is configured to direct the transmit signal to the antenna via the filter circuitry and the pHEMT switching circuit, and to receive a receive signal from the antenna and direct the receive signal to the transceiver via the pHEMT switching circuit and the filter circuitry.

In one example of the wireless device the transceiver includes a transmit circuit configured to produce the transmit signal and a receive circuit configured to receive the receive signal from the pHEMT switching circuit and the filter circuitry. The wireless device may further comprise a baseband processing sub-system coupled to the transceiver.

According to another embodiment, a method of improving linearity in a pHEMT switch is provided. The method comprises acts of determining a first amplitude and a first phase of a first harmonic signal produced at a load by the pHEMT switch in an ON state, and tuning a gate resistance connected to a gate of the pHEMT switch to produce a second harmonic signal at the load, the second harmonic signal having a second amplitude and a second phase that is opposite to the first phase such that a net harmonic signal at the load corresponding to a sum of the first harmonic signal and the second harmonic signal has a power level of less than −50 dBm.

In one example tuning the gate resistance includes selectively connecting together selected ones of a plurality of switchable resistors. The method may further comprise monitoring the net harmonic signal, wherein tuning the gate resistance includes tuning the gate resistance to minimize the net harmonic signal. The method may further comprise monitoring the net harmonic signal, wherein tuning the gates resistance includes adjusting a resistance of at least one variable resistor connected to the gate of the pHEMT switch to minimize the net harmonic signal.

According to another embodiment, a method of improving linearity in a pHEMT switch comprises acts of determining a first amplitude and a first phase of a first harmonic signal produced at a load by the pHEMT switch in an ON state, and tuning a gate resistance connected to a gate of the pHEMT switch to produce at the load a second harmonic signal having a second amplitude and a second phase that is opposite to the first phase so as to minimize a net harmonic signal at the load, the net harmonic signal corresponding to a sum of the first harmonic signal and the second harmonic signal.

In one example the method further comprises driving the pHEMT switch in the ON state with an input signal having a fundamental frequency, the first and second harmonic signals corresponding to third harmonics of the fundamental frequency.

The method may further comprise monitoring the net harmonic signal, and providing a control signal to tune the gate resistance based on the monitored net harmonic signal. In one example tuning the gate resistance includes selectively connecting together selected ones of a plurality of switchable resistors. In another example tuning the gate resistance includes adjusting a resistance of at least one variable resistor connected to the gate of the pHEMT switch.

Another embodiment is directed to a method of improving linearity in a pHEMT amplifier, the method comprising determining a first amplitude and a first phase of a first harmonic signal produced at a load by the pHEMT amplifier in an ON state, and tuning a non-linear resistance connected to the pHEMT amplifier to produce a second harmonic signal at the load, the second harmonic signal having a second amplitude and a second phase that is opposite to the first phase so as to minimize a net harmonic signal at the load, the net harmonic signal corresponding to a sum of the first harmonic signal and the second harmonic signal.

In one example the method further comprises driving the pHEMT amplifier in the ON state with an input signal having a fundamental frequency, the first and second harmonic signals corresponding to third harmonics of the fundamental frequency. The method may further comprise monitoring the net harmonic signal, and providing a control signal to tune the non-linear resistance based on the monitored net harmonic signal. In one example tuning the non-linear resistance includes selectively connecting together selected ones of a plurality of switchable resistors. In another example tuning the non-linear resistance includes adjusting a resistance of at least one variable resistor connected to the pHEMT amplifier.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 8A is a plot of one example of a simulated fundamental frequency (H1) signal in the circuit of FIG. 7;

FIG. 8B is a plot of one example of a simulated third harmonic frequency (H3) signal in the circuit of FIG. 7;

FIG. 10 is a graph of simulated third harmonic (H3) signals, demonstrating harmonic cancellation according to aspects of the present invention;

DETAILED DESCRIPTION

Figure 1:
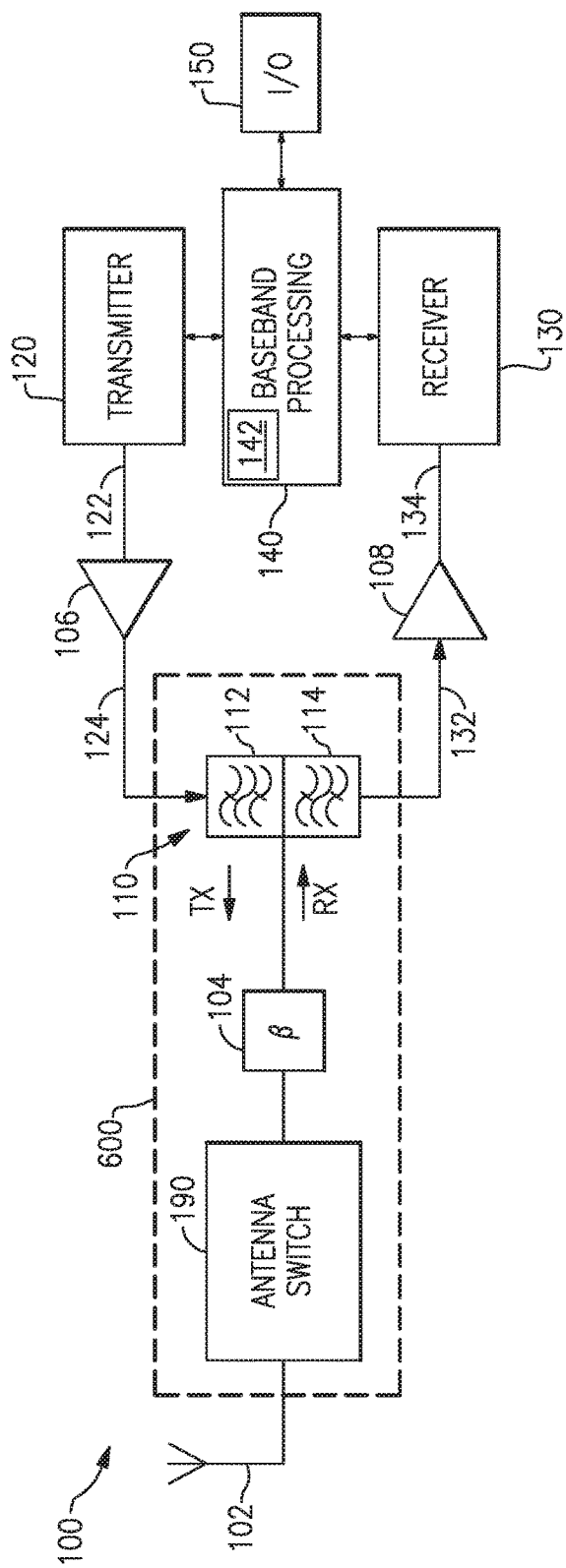
FIG. 1 is a block diagram of one example of a wireless device including a pHEMT-based antenna switch and a pHEMT-based low noise amplifier according to aspects of the present invention.

In modern wireless communications devices the antenna switch or transceiver switching circuitry used to achieve multi-mode (e.g., transmit and receive modes) and multi-band operation is a key element. Switches using pHEMTs (pseudomorphic high electron mobility transistors) have demonstrated their advantages, including low insertion loss, high power, and higher linearity compared to other switching technologies. However, as discussed above, further improving the linearity of the switches can be an important design factor. In particular, for a multi-band multi-mode switch, small power linearity may be of primary concern. Similarly, linearity performance in the low noise amplifier(s), which may also be transistor-based and use pHEMTs, can also be an important design factor. For example, the modern design specification for a dual-band PCS and WCDMA wireless transceivers sets forth the following parameters: for high-band power=20 dBm at 1.95 GHz with PCS-band small power=−15 dBm at 1.76 GHz, the third order intermodulation product (IMD3) at 2.14 GHz (the WCDMA band) should be as low as −105 dBm. To achieve compliance with such design specifications, the harmonics generated by the components, for example in the switching arms of the pHEMT (or other) switches or "ON" state transistors in the amplifiers, must be reduced as much as possible.

Accordingly, aspects and embodiments are directed to methods and structures for improving component linearity through harmonic cancellation between a pHEMT and a non-linear resistor used in the component design. As discussed in more detail below, rather than attempting to reduce the harmonics generated by the pHEMT ON arms, certain embodiments provide an approach in which substantially matching harmonics with opposite phase are intentionally generated and used to cancel out the harmonics generated by the pHEMT ON arms, thereby achieving a significant reduction in the overall harmonic signal strength.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

FIG. 1 is a schematic diagram illustrating wireless device 100 including an example of an antenna switch 190 and a low noise amplifier 108, each having improved linearity according to certain embodiments. The antenna switch 190 is generally implemented in hardware. However, one or more of the signals that control the antenna switch 190 can be implemented in software, or a combination of hardware and software. When implemented in hardware, the antenna switch 190 can be implemented using specialized hardware elements, as discussed further below. When one or more of the control signals for the antenna switch 190 are generated at least partially in software, the software portion can be used to precisely control the operating aspects of various components in the antenna switch. The software can be stored in a memory and executed by a suitable instruction execution system (e.g., a microprocessor). The hardware implementation of the antenna switch can include any or a combination of the following technologies, which are all well known in the art: discrete electronic components, discrete logic circuit(s) having logic gates for implementing logic functions upon data signals, an application specific integrated circuit having appropriate logic gates, a programmable gate array(s) (PGA), a field programmable gate array (FPGA), a separate, specially designed integrated circuit for biasing purposes, etc.

The wireless device 100 includes an antenna 102 coupled to the antenna switch 190. The antenna switch 190 is coupled to a phase shift element 104, which is in turn connected to filter circuitry 110. The filter circuitry 110 includes a transmit filter 112 and a receive filter 114. The wireless device 100 further includes a transmitter 120 that supplies a transmit (Tx) signal 122 to a power amplifier 106 that amplifies the signal. The transmit filter 112 receives the amplified signal 124 output from the power amplifier 106.

The receive filter 114 delivers the receive (Rx) signal 132 to a low noise amplifier 108. The amplified Rx signal 134 output from the low noise amplifier 108 is supplied to a receiver 130. The transmitter 120 and the receiver 130 are shown for illustrative purposes only. Various configurations and implementation of a transmitter and receiver, whether implemented as separate components or part of a transceiver, are known to those having ordinary skill in the art and all such implementations are contemplated herein. The wireless device 100 also comprises baseband processing circuitry 140 coupled to the transmitter 120 and to the receiver 130. The baseband processing circuitry 140 performs baseband signal processing for the transmit signal and for the receive signal as known in the art. If one or more portions or aspects of the antenna switch 190 are implemented in software, then the baseband processing circuitry includes the switch software 142.

The baseband processing circuitry 140 is coupled to an input/output element 150. The input/output element 150 may comprise a microphone, speaker, keyboard, pointing device, or other interface elements.

As discussed further below, in certain embodiments, the antenna switch 190, phase shifter 104, and filter circuitry 110 can be combined into a module 600, such as a duplexer module or diplexer module, for example.

According to certain embodiments the antenna switch 190 can be implemented using one or more pHEMT switches. Further, the low noise amplifier 108 may be implemented using one or more pHEMTs for amplification. When used in either an amplifier or a switch, a pHEMT typically has at least one associated gate or drain/source resistor. Conventionally, these resistors are linear resistors. Bulk (also called "epi") resistors are non-linear resistors that produce non-linearities, such as harmonics and intermodulation distortion products, as do transistors. By adjusting the geometric size (e.g., length or width) of these bulk resistors, the non-linearity properties can be increased or decreased in a controlled or predictable manner. When the bulk resistors and associated transistors (e.g., pHEMTs) are produced during the same manufacturing process, they will have similar non-linearity. According to certain aspects and embodiments disclosed herein, the non-linearity of these bulk resistors can be exploited in pHEMT-based amplifier or switch designs to cancel the harmonics (e.g., IMD3) produced by the pHEMTs, thereby improving the performance of the amplifier or switch.

Figure 2:
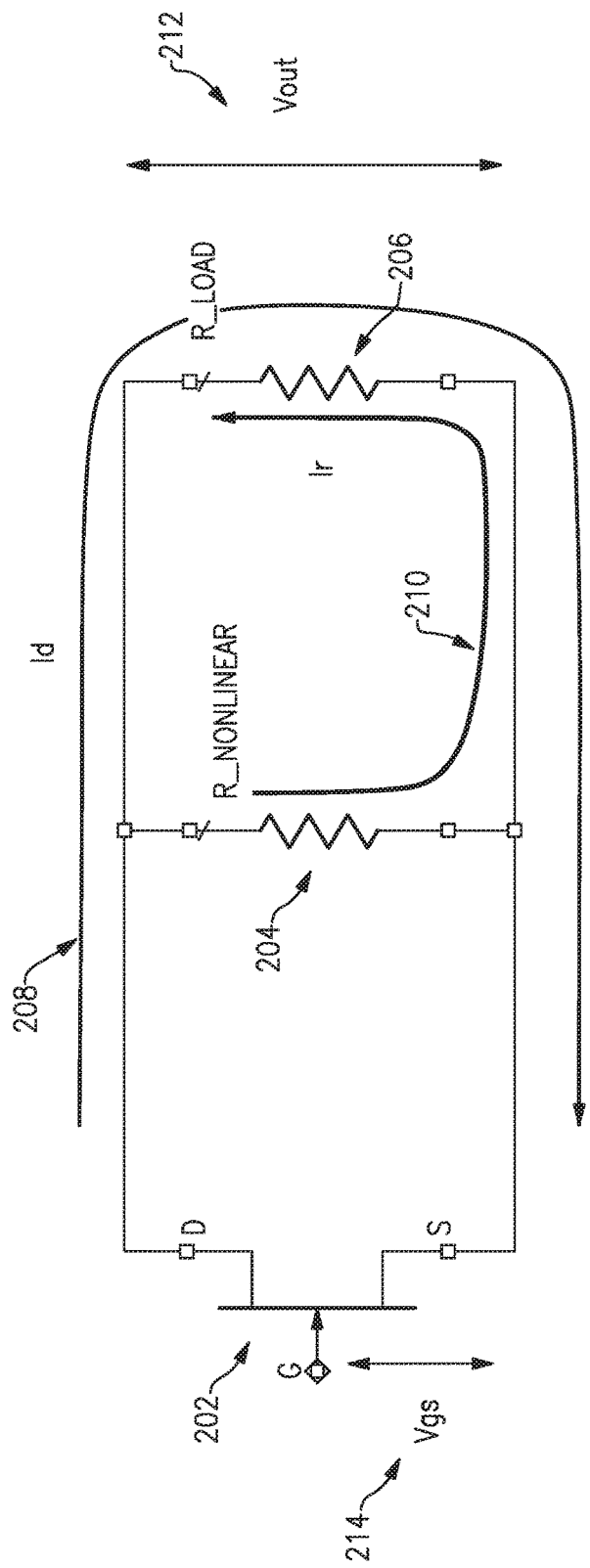
FIG. 2 is a simplified circuit diagram of one example of a pHEMT connected with an associated non-linear resistor and a load, according to aspects of the present invention.
Figure 16A:
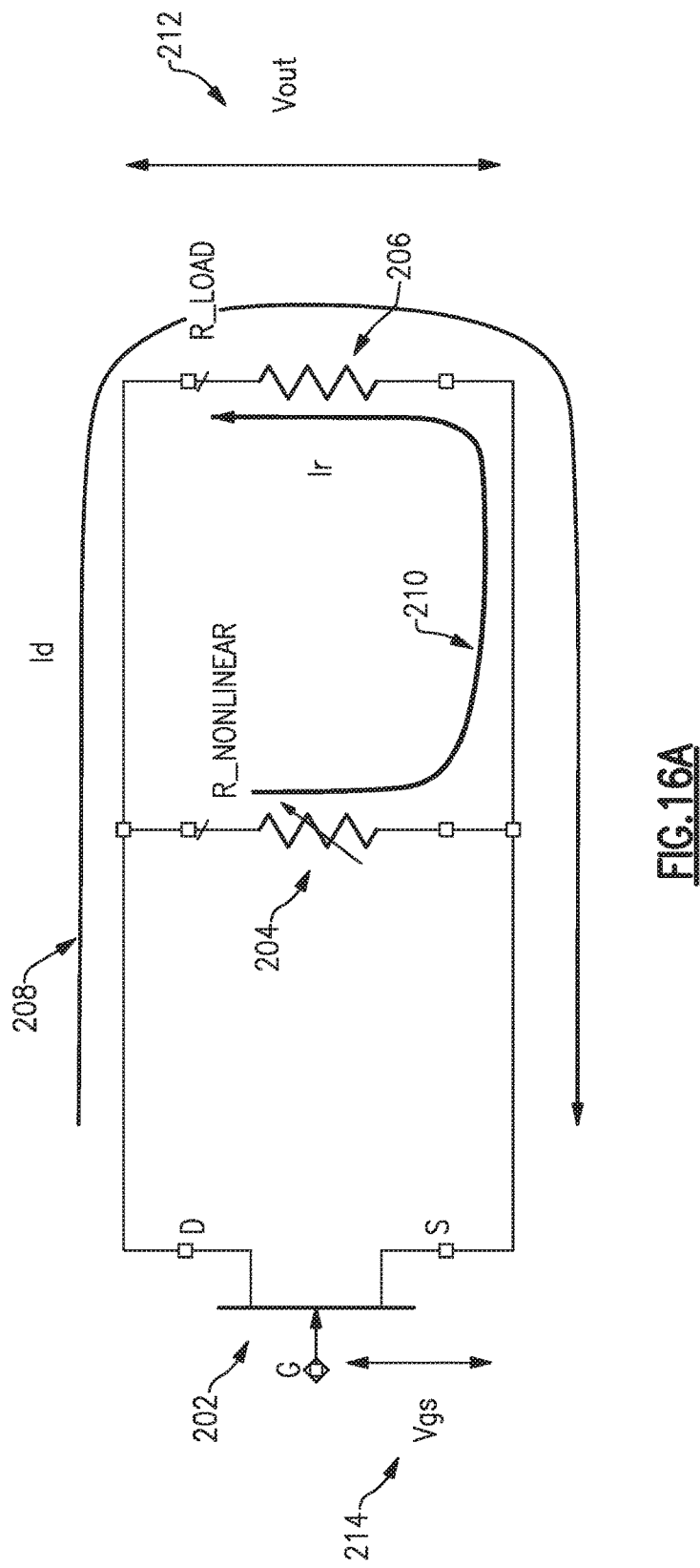
FIG. 16A is another version of the circuit diagram of FIG. 2 showing the non-linear resistor 204 implemented as a variable resistor according to aspects of the present invention.

As discussed in more detail below, simulations and analytical calculations demonstrate that the harmonics produced by a non-linear resistor can be used to cancel harmonics produced by a pHEMT, thereby leading to reduced intermodulation products and improved linearity performance in the component (e.g., switch or amplifier) in which the pHEMT and non-linear resistor combination is used. FIG. 2 is a schematic circuit diagram of a pHEMT 202 connected with an associated non-linear resistor 204 and a load resistance 206. FIG. 16A shows another version of the schematic circuit diagram of FIG. 2 showing the non-linear resistor 204 implemented as a variable resistor. A combination of the drain current ($I_d$) 208 from the pHEMT 202 and the current ($I_r$) 210 through the non-linear resistor 204 produces an output voltage ($V_{out}$) 212 across the load resistance 206. A gate-to-source voltage ($V_{gs}$) 214 on the pHEMT 202 produces the drain current $I_d$ 208. The resistor current $I_r$ 210 is given by:

$$I_r = I_s \tanh\left(\frac{V_{out}}{R_B I_s}\right) \quad (1)$$

In Equation (1), $I_s$ is the saturation current and $R_B$ is the resistance value of the non-linear resistor 204. To model the third harmonics of the resistor 204, the third derivative (y''') of a generic form Equation (1) is taken, and is represented as follows:

$$y''' = 2\mathrm{sech}^2(x)[3\tan h^2(x) - 1] \quad (2)$$

Figure 3A:
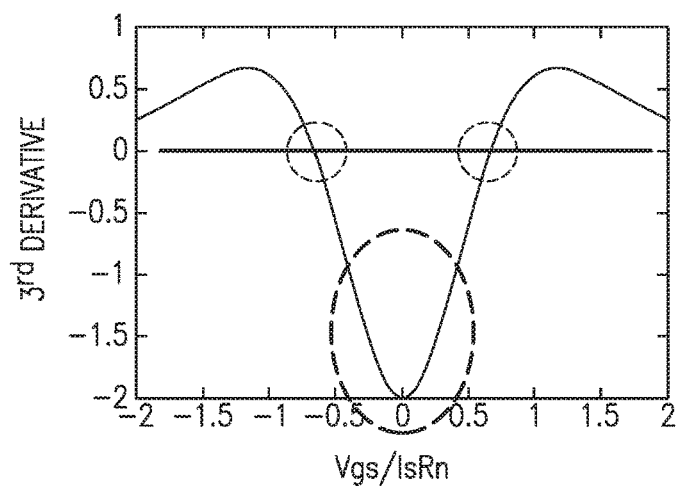
FIG. 3A is a graph showing one example of the third derivative curve of a non-linear resistor.
Figure 3B:
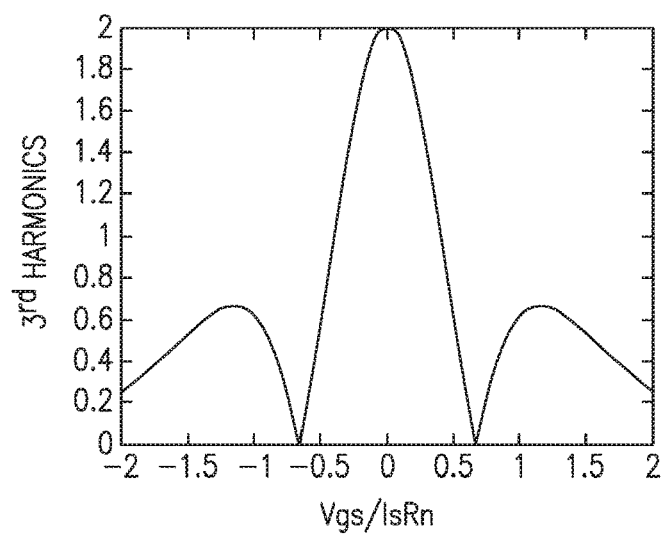
FIG. 3B is a graph showing one example of third harmonics of a non-linear resistor, corresponding to the third derivative curve shown in FIG. 3A.

In Equation (2), "x" and "y" are generic variables used for simplicity. FIG. 3A is a graph illustrating an example of the third derivative according to Equation (2) as a function of Vgs/IsRn, and FIG. 3B is a graph illustrating the corresponding third harmonics of a modeled non-linear resistor 204.

Figure 4:
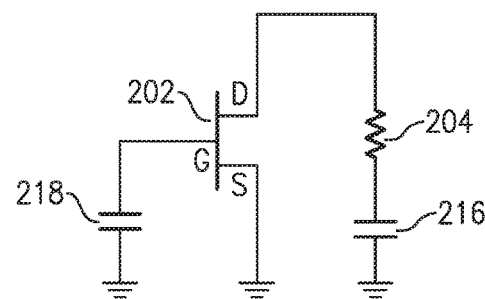
FIG. 4 is a simplified circuit diagram showing a pHEMT connected in a common source circuit configuration.

Similarly, the pHEMT 202 produces third harmonics. Modeling the pHEMT 202 in a simplified common source circuit configuration, as shown in FIG. 4, the pHEMT can be considered as a controlled current source with the non-linear resistor 204 acting as a shunt resistor connected to ground. For signals in the radio frequency (RF) band or other typical communications frequency bands (e.g., mm-wave, microwave, etc.), DC blocking capacitors 216 and 218 appear essentially as short-circuits. Considering the pHEMT simplified to a controlled current source, and referring again to FIG. 2, the drain current ($I_d$) 208 is a function of the gate-to-source voltage (Vgs) 214:

$$I_d = f(V_{gs}) \quad (3)$$

Equation (3) can be approximated as follows:

$$I_d = I_{dss} + a_1 V_{gs} + a_2 V_{gs}^2 + a_3 V_{gs}^3 + \ldots \quad (4)$$

The coefficients $a_n$ in Equation (4) can be determined by fitting $I_d$ to a curve of the measured or simulated gain ($G_m$) of the pHEMT 202 as a function of $V_{gs}$. In one example, the measured/simulated gain as a function of the $V_{gs}$, can be fit with a polynomial (Equation (5) below), and the gain for the second ($G_{m2}(V_{gs})$) and third ($G_{m3}(V_{gs})$) harmonics can be calculated as follows by taking the second and third derivatives, with respect to the voltage, $V_{gs}$, of Equation (5), respectively, leading to Equations (6) and (7):

$$G_m(V_{gs}) = P_0 + P_1 V_{gs} + P_2 V_{gs}^2 + P_3 V_{gs}^3 + P_4 V_{gs}^4 + P_5 V_{gs}^5 + P_6 V_{gs}^6 + P_7 V_{gs}^7 \quad (5)$$

$$G_{m2}(V_{gs}) = P_1 + 2P_2 V_{gs} + 3P_3 V_{gs}^2 + 4P_4 V_{gs}^3 + 5P_5 V_{gs}^4 + 6P_6 V_{gs}^5 + 7P_7 V_{gs}^6 \quad (6)$$

$$G_{m3}(V_{gs}) = 2P_2 + 6P_3 V_{gs} + 12P_4 V_{gs}^2 + 20P_5 V_{gs}^3 + 30P_6 V_{gs}^4 + 42P_7 V_{gs}^5 \quad (7)$$

From Equations (5) and (7), expressions for the power in a signal at the fundamental frequency (corresponding to the desired carrier frequency or desired frequency of operation of the pHEMT device), $P_0$, and the power in the third harmonic of that signal, $P_{IMD3}$, corresponding to the third intermodulation distortion product, can be calculated as follows:

$$P_0(V_{gs}) = 10*\log(4G_m^2 R_B R_L) + P_{in} \quad (8)$$

$$P_{IMD3}(V_{gs}) = 10*\log(4G_{m3}^2 R_3^3 R_L) + 3P_{in} - 60 \quad (9)$$

$P_{in}$ is the input power (in dBm) and $R_L$ is the resistance value of the load resistance 206. These equations provide an analytical expression describing the intermodulation distortion products or harmonics generated by the combination of the pHEMT 202 and resistor 204.

Referring again to FIG. 2, as shown, the currents $I_d$ and $I_r$ flow in opposite directions through the load resistance 206. Accordingly, the load current ($I_{LOAD}$) is given by:

$$I_{LOAD} = I_d - I_r \quad (10)$$

As noted above, $I_r$ is given by Equation (1) and can be approximated by:

$$I_r \approx I_s \tanh\left(\frac{R_L I_d}{R_n I_s}\right) \quad (11)$$

The third intermodulation distortion product is proportional to the third derivative of the load current, $I_{LOAD}$, taken with respect to the voltage, $V_{gs}$, 214, as expressed in Equation (12) below:

$$P_{IMD3} \propto \frac{\delta^3 I_{LOAD}}{\delta V_{gs}^3} \quad (12)$$

For the case where the resistor 204 is a linear resistor, the signal power in the third harmonic is proportional simply to the gain of the pHEMT at the third harmonic frequency and the following condition holds:

$$\frac{\delta^3 I_{LOAD}}{\delta V_{gs}^3} = G_{m3} \quad (13)$$

However, in the case where the resistor 204 is a non-linear resistor, harmonic cancellation can be achieved between the third harmonics generated by the resistor 204 and the third harmonics generated by the pHEMT 202. In this case:

$$\frac{\delta^3 I_{LOAD}}{\delta V_{gs}^3} = G_{m3}(1 - G_{r3}) - 2G_{r2}G_{m2} - G_{r3}G_m \quad (14)$$

$G_r$, $G_{r2}$, and $G_{r3}$ are the "gain" terms of the non-linear resistor 204 corresponding to the fundamental frequency, second harmonic, and third harmonic, respectively, and are given by:

$$G_r = \frac{\delta I_r}{\delta I_d} \quad (15)$$

$$G_{r2} = \frac{\delta^2 I_r}{\delta I_d^2} \quad (16)$$

$$G_{r3} = \frac{\delta^3 I_r}{\delta I_d^3} \quad (17)$$

Thus, from Equations (13) and (14) it can be seen that the power in the third harmonic or third intermodulation distortion product can be reduced by harmonic cancellation if the resistor 204 is designed such that:

$$G_{m3} > G_{m3}(1 - G_{r3}) - 2G_{r2}G_{m2} - G_{r3}G_m \quad (18)$$

Simulations of a common source pHEMT, as shown in FIG. 4, were performed to demonstrate correlation between simulated measured data and the results expected based on the analytical expression presented above in Equations (1)-(18). For the simulations, the pHEMT 202 had a gate width of 50 micrometers (μm) and a pinch voltage ($V_{pinch}$) of 0.8 volts (V), the resistor 204 had a value of $R_B$=515 Ohms, a width of 4 μm and a length of 7.65 μm, and the capacitor 216 had a capacitance value of C=1.0 microFarads (μF). Simulations were also performed to demonstrate benefits obtained by using a non-linear resistor 204 rather than a linear resistor.

Figure 5A:
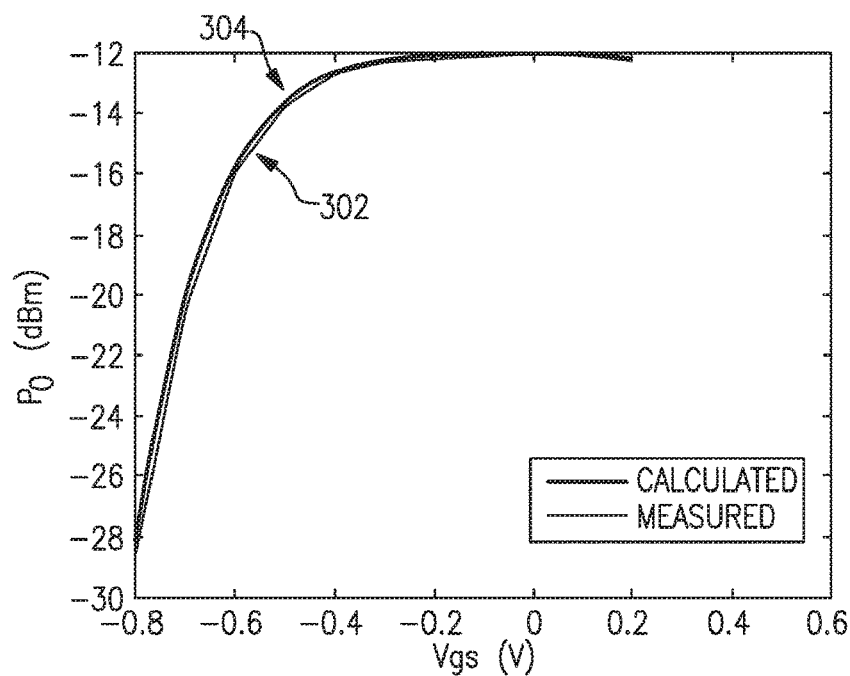
FIG. 5A is graph showing simulated and calculated signal power at a fundamental frequency as a function of the gate-to-source voltage of the pHEMT in the circuit of FIG. 2.
Figure 5B:
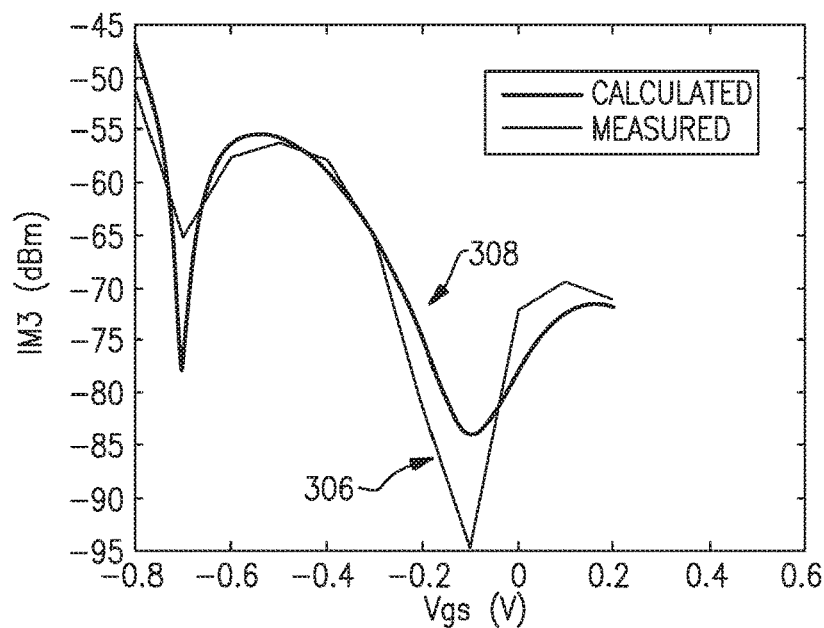
FIG. 5B is a graph showing corresponding simulated and calculated signal power at a third harmonic frequency as a function of the voltage gate-to-source voltage of the pHEMT in the circuit of FIG. 2.

FIGS. 5A and 5B are graphs showing comparative results obtained from calculations according to Equations (8) and (9) and corresponding simulations. FIG. 5A is a graph showing the signal power at the fundamental frequency, $P_0$, as a function of the voltage ($V_{gs}$) 214. In FIG. 5A, curve 302 represents the simulated measurement and curve 304 represents the expected results calculated from Equation (8). As shown, there is close agreement between the simulated and calculated performance. FIG. 5B is a graph showing the signal power at the third harmonic frequency ($P_{IMD3}$) as a function of the voltage ($V_{gs}$) 214. In FIG. 5B, curve 306 represents the simulated measurement and curve 308 represents the expected results calculated from Equation (9).

Figure 6A:
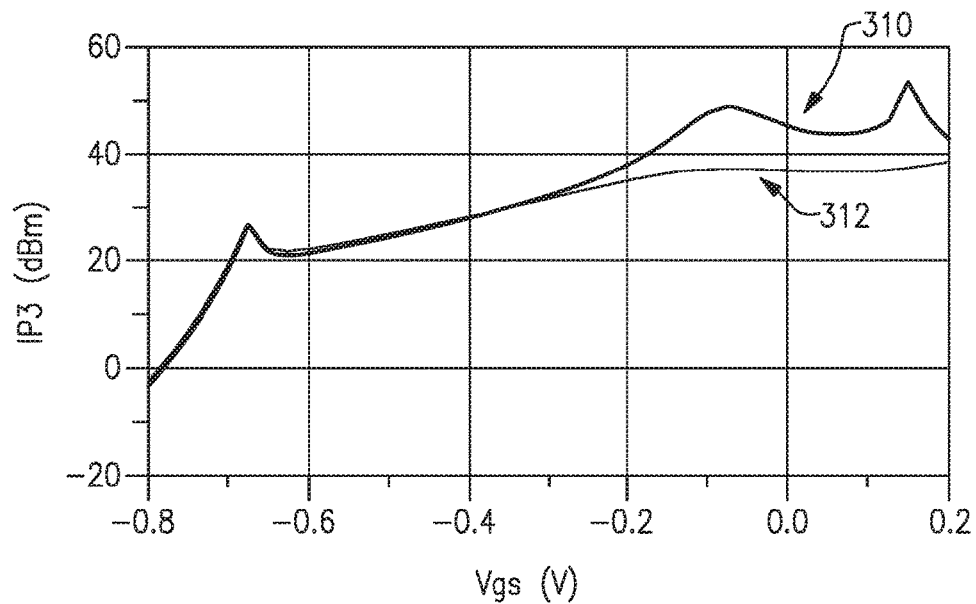
FIG. 6A is a graph showing the simulated third order intercept point of the pHEMT as a function of the gate-to-source voltage of the pHEMT in the circuit of FIG. 2.

Referring to FIG. 6A there is shown a graph of the simulated third order intercept point of the pHEMT 202 as a function of the voltage ($V_{gs}$) 214. In FIG. 6A, curve 310 corresponds a non-linear resistor 204, and curve 312 shows a comparative example with a linear resistor. As may be seen with reference to FIG. 5A, the use of the non-linear resistor 204 provides approximately a 10 dBm improvement in the third order intercept point at higher voltages.

Figure 6B:
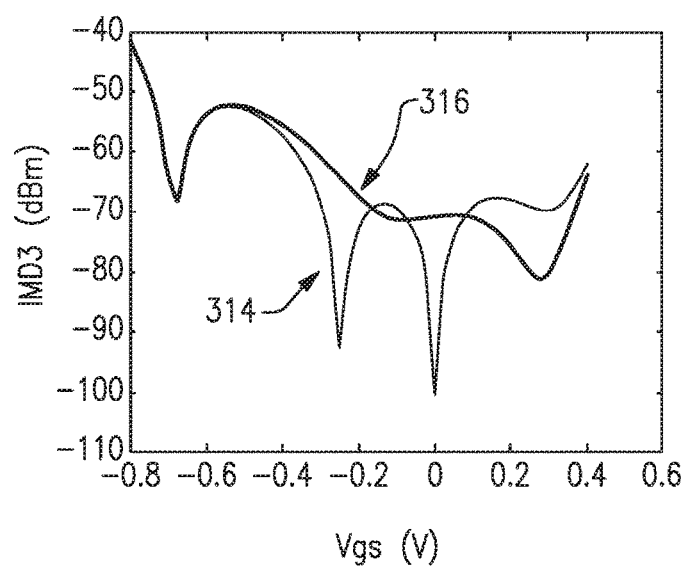
FIG. 6B is a graph showing the simulated third intermodulation distortion product at the load resistance as a function of the gate-to-source voltage of the pHEMT in the circuit of FIG. 2.

FIG. 6B is a graph showing the simulated third intermodulation distortion product at the load resistance 206 as a function of the voltage ($V_{gs}$) 214. In FIG. 6B, curve 314 corresponds to the case in which the resistor 204 is a non-linear resistor 204, and curve 316 shows a comparative example with a linear resistor. As shown, the use of the non-linear resistor 204 provides a significant benefit, consistent with the predictions based on the analytical expressions discussed above. Thus, the simulation demonstrates that there is a change, and in particular, an improvement, in the third intermodulation product or third harmonic performance due to the use of the non-linear resistor 204.

Thus, it has been demonstrated both analytically and through simulations that harmonic cancellation can be achieved using a combination of a pHEMT and a non-linear resistor. When the pHEMT is used in an amplifier, using a bulk resistor, or other non-linear resistor, for the resistor 204 shown in the simplified circuits of FIGS. 2 and 4, the third order intercept point (IP3) of the pHEMT 202 can be increased, and at least certain intermodulation distortion products (such as the IMD3) of the pHEMT can be substantially canceled by the corresponding intermodulation distortion products produced by the non-linear resistor 204. A pHEMT in this configuration may be used in the buffer stage of a cascode amplifier of the low noise amplifier 108, for example. Thus, decreased intermodulation distortion products, and resulting improved linearity can be achieved in the low noise amplifier 108.

Figure 7:
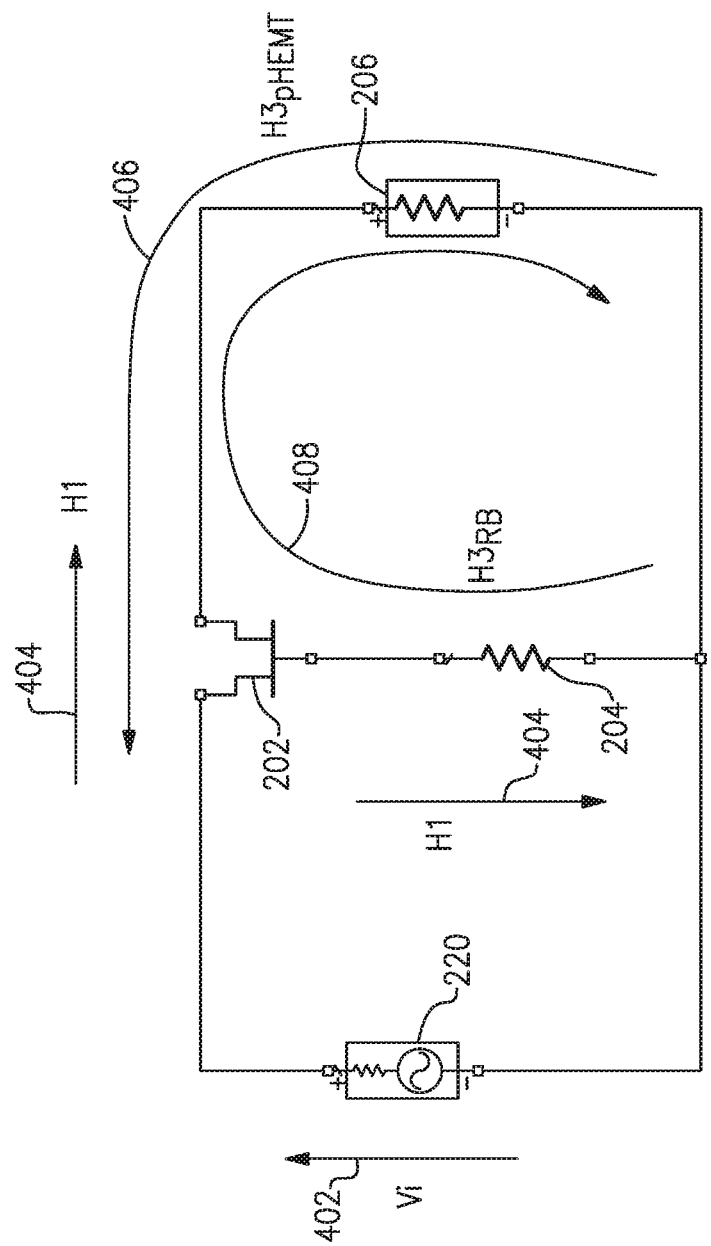
FIG. 7 is a schematic equivalent circuit diagram for an example of a pHEMT connected in a switch configuration and including a non-linear gate resistor according to aspects of the present invention.
Figure 16B:
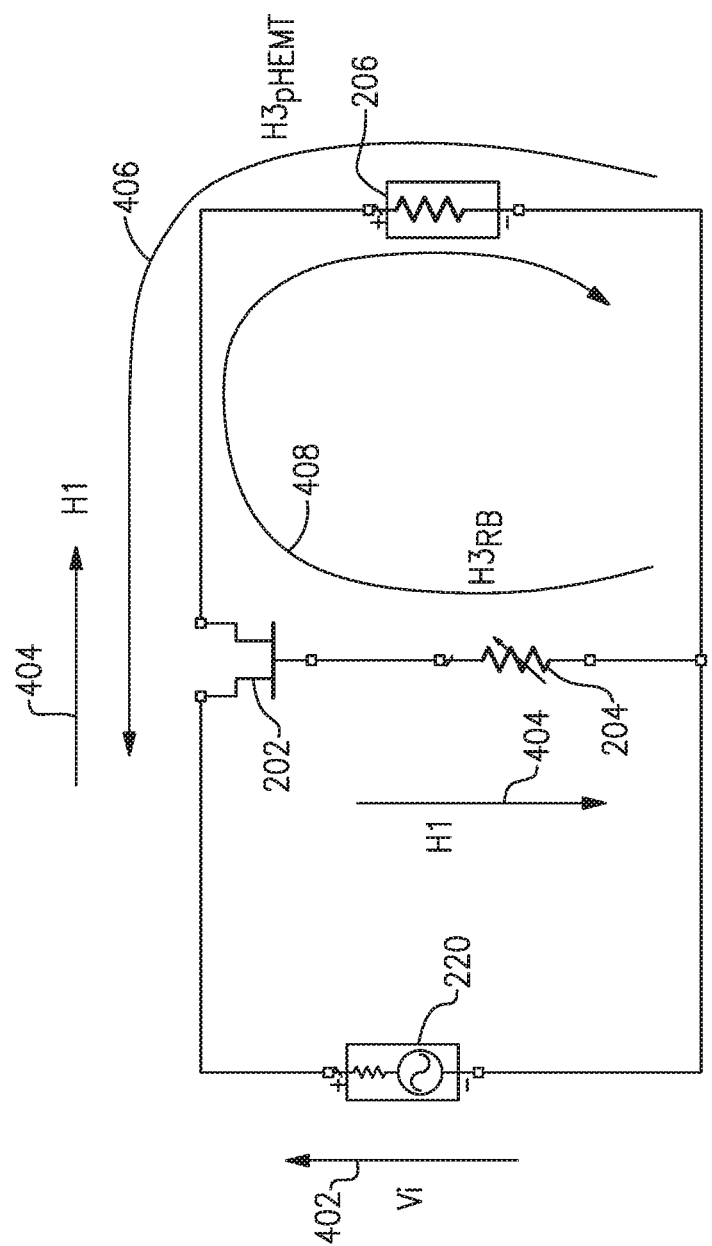
FIG. 16B is another version of the circuit diagram of FIG. 7 showing the non-linear resistor 204 implemented as a variable resistor according to aspects of the present invention.

Similarly, improved linearity in the antenna switch 190 can be achieved by using a pHEMT in combination with a non-linear resistor. FIG. 7 is an equivalent circuit diagram for simulating operation of a series connected pHEMT used in a switch configuration. FIG. 16B shows another version of the circuit diagram of FIG. 7 with the non-linear resistor 204 implemented as a variable resistor. The circuit includes the pHEMT 202 connected in series between a voltage source 220 and the load resistance 206. For example, where the pHEMT switch is used in the antenna switch 190, as shown in FIG. 1, the load resistance 206 represents the antenna 102. As discussed above, minimizing the IMD3 signals at the antenna 102 is particularly desirable in multi-band, multi-mode transceivers. The gate of the pHEMT 202 is connected to the non-linear resistor 204. The voltage source 220 produces a drive signal (having a voltage $V_i$) 402 that includes a fundamental or carrier frequency (H1) represented by 404. Responsive to receiving the drive signal 402, the pHEMT 202 produces currents corresponding to harmonics of the fundamental frequency, as discussed above, and in particular, a third harmonic frequency (H3$_{pHEMT}$) 406, also known as the third intermodulation product (IMD3). In this configuration, the current at the drain of the pHEMT 202 ($I_d$) is given by:

$$I_d \propto \tanh(V_i) \approx V_i - \frac{V_i^3}{3} \qquad (19)$$

In Equation (19), $V_i^3$ is the voltage of the third harmonic frequency 406. As discussed above, the non-linear resistor 204 also generates harmonic currents, including a third harmonic frequency (H3$_{RB}$) 408.

As discussed above, the non-linear resistor 204 can be configured so as to influence the harmonics it generates, in particular the third harmonic frequency, such that harmonic cancellation can be achieved between the harmonics generated by the pHEMT 202 and the harmonics generated by the resistor 204. As a result, the net harmonics, in particular the net IMD3, at the load resistance 206 can be minimized. In particular, as shown in FIG. 7, the H3$_{RB}$ current 408 from the non-linear resistor 204 and the H3$_{pHEMT}$ current 406 from the pHEMT 202 are flowing in opposite directions at the load resistance 206, as is the case in the amplifier configuration shown in FIG. 2. Thus, by controlling the amplitude and frequency of the H3$_{RB}$ current 408 from the gate resistor 204 to substantially match (but being opposite in phase/direction to) the H3$_{pHEMT}$ current 406 produced by the pHEMT 202, harmonic cancellation can be achieved at the load resistance 206, thereby achieving the desired result of minimizing the net harmonics (or IMD3 signals).

FIGS. 8A-B and 9A-B illustrate simulated results demonstrating this concept for the switch configuration of FIG. 7.

As shown in FIG. 7, the third harmonic frequency 406 is opposite in phase to the fundamental frequency 404 of the drive signal 402. This is illustrated in FIGS. 8A and 8B. FIG. 8A is a diagram showing the simulated amplitude and phase of the fundamental frequency (H1) 404 from the ON-state pHEMT 202, and FIG. 8B is a diagram showing the simulated amplitude and phase of the third harmonic frequency (H3$_{pHEMT}$) 406 from the ON-state pHEMT 202. Comparing FIGS. 8A and 8B, it can be seen that the fundamental frequency 404 and the third harmonic frequency 406 are in opposite phase, and that the amplitude (voltage level) of the fundamental frequency 404 is significantly greater than that of the third harmonic frequency 406.

Figure 9B:
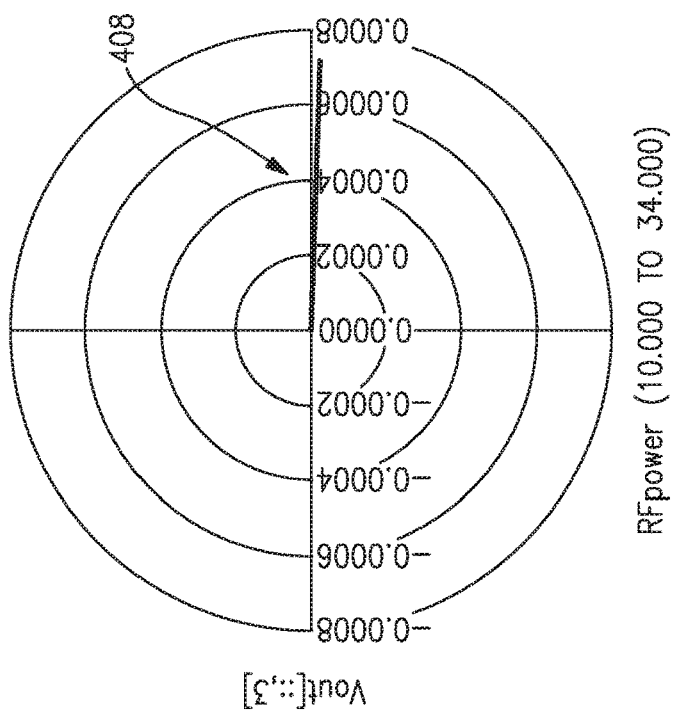
FIG. 9B is a plot of one example of a simulated third harmonic frequency (H3) current generated by the gate resistor in the circuit of FIG. 7.
Figure 9A:
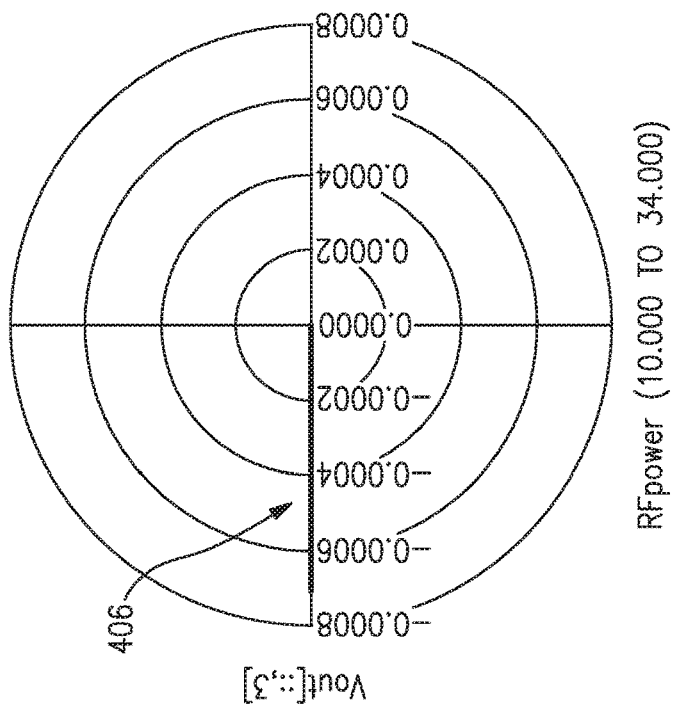
FIG. 9A is a plot of one example of a simulated third harmonic frequency (H3) current generated by the pHEMT in the circuit of FIG. 7.

FIG. 9A shows the amplitude and phase of one example of the simulated H3$_{pHEMT}$ current 406 from the pHEMT 202, and FIG. 9B shows the amplitude and phase of one example of the simulated H3$_{RB}$ current 408 from the gate resistor 208. As shown, the two simulated H3 currents 406 and 408 have similar amplitude and are opposite in phase.

Controlling or changing the linearity of the pHEMT 202 can be difficult. However, configuring the non-linear resistor 204 to achieve harmonic cancellation as discussed above can be easily achieved by adjusting the length or width of the resistor. The non-linearity of the resistor 204 is determined by the saturation current ($I_s$) and the resistance value ($R_B$), both of which are influenced by the resistor's length (L) and width (w):

$$R_B = R_{sh}\frac{L}{w} \qquad (20)$$

$$I_s = J_s w e^{-\alpha L} \qquad (21)$$

In Equations (20) and (21) $R_{sh}$ is the sheet resistance of the layer of material (epi-layer) from which the resistor 204 is formed, $J_s$ is the saturation current density, and $\alpha$ is a parameter introduced to describe the length-dependence of the saturation current ($I_s$). Thus, by appropriately selecting the physical properties of the non-linear resistor 204, the non-linearity and resulting harmonics (amplitude, phase, and frequency) of the resistor can be controlled.

FIG. 10 is a graph illustrating the simulated H3 currents (in units of dBm) as a function of the resistance value (in kilo-Ohms) of the non-linear resistor 204 connected as a gate resistor for the pHEMT 202, as shown in FIG. 7. For this simulation, the pHEMT 202 is a single-gate HEMT having a gate-width ($W_g$) of 1500 micrometers (μm), and the drive signal 402 is a 900 MHz tone. In FIG. 10, curve 318 corresponds to the simulated H3$_{pHEMT}$ current 406 from the pHEMT 202, curve 320 corresponds to the simulated H3$_{RB}$ current 408 from the gate resistor 204, and curve 322 corresponds to the simulated combined net H3 current at the load resistance 206. As can be seen with reference to FIG. 10, for a given fundamental frequency (H1) or drive signal 402, and for a given gate-width of the pHEMT 202, the net H3 current 322 varies with change in the resistance value (Rg) of the gate resistor 204. For resistance values below a certain value (region 324), the net H3 current 322 is dominated by the H3$_{RB}$ current 408 produced by the resistor 204 (curve 322 is similar to curve 320 in this region). However, for resistance values within a certain range, corresponding to region 326, the H3 currents from the pHEMT 202 and the resistor 204 act to substantially cancel one another such that the net H3 current 322 is relatively low. The simulations further show that if the resistance value of the gate resistor 204 is further increased, the H3 currents 406 and 408 no longer substantially match and cancel one another; instead, the net H3 current 322 is dominated by the H3$_{pHEMT}$ current 406 produced by the pHEMT 202 (curve 322 approaches curve 318 in region 328). Thus, for a given fundamental frequency (H1) and for a given gate-width of the pHEMT 202, an optimal resistance value of the non-linear resistor 204 can be determined that results in a minimized net H3 current, as indicated by arrow 330. As discussed above, the IMD3 or net H3 current 322 is a dominant factor in the linearity of a pHEMT switch or amplifier. Thus, the simulation data presented in FIG. 10 demonstrates that switch linearity can be improved using the harmonic cancellation technique discussed herein.

The simulations shown in FIG. 10 demonstrate that an optimal resistance value of the non-linear resistor 204 connected as a gate resistor can be determined for a given gate-width of the pHEMT 202. However, as shown in FIGS. 11A-11B and 12A-12B, the optimal resistance value at which the net H3 current is minimized varies with changing gate-widths of the pHEMT 202.

Figure 11B:
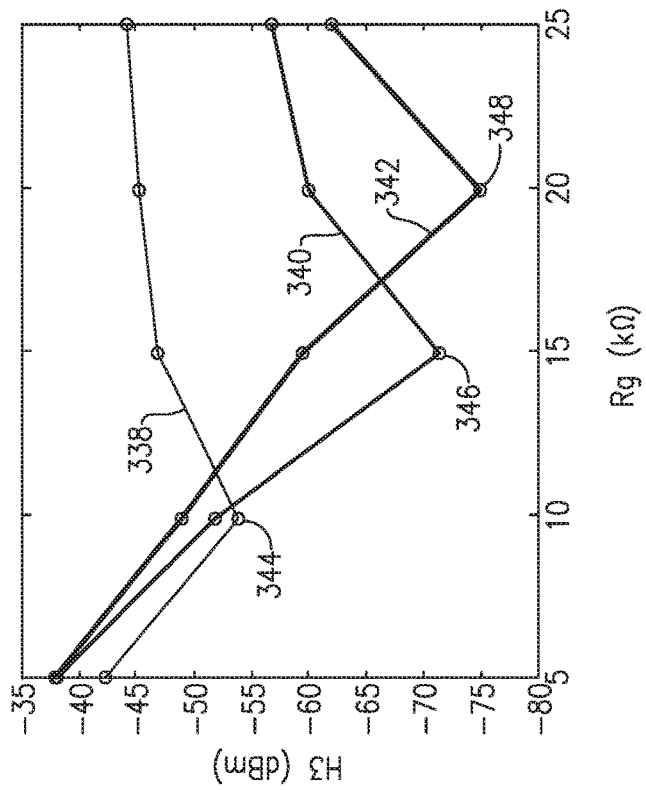
FIG. 11B is a graph of measured net third harmonic signals for varying gate-widths of one example of a single-gate pHEMT connected as shown in FIG. 7.
Figure 11A:
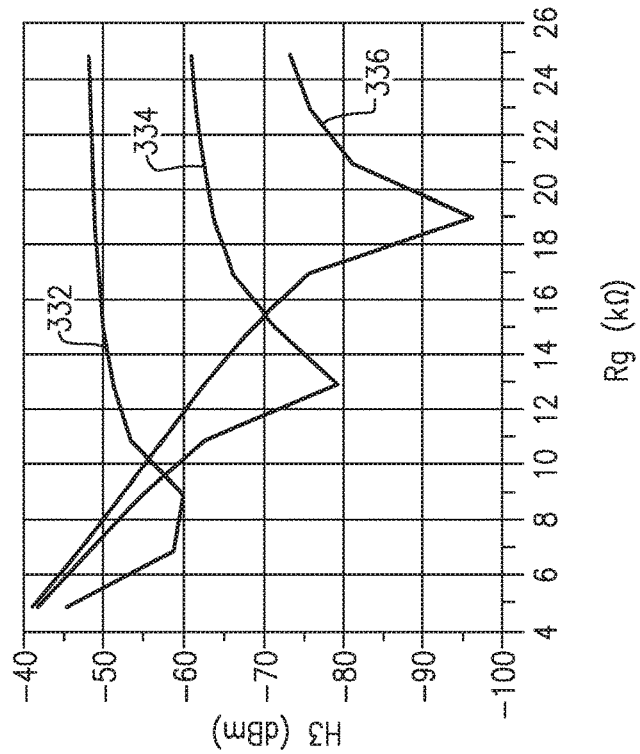
FIG. 11A is a graph of simulated net third harmonic signals at the load in FIG. 7 for varying gate-widths of a single-gate example of the pHEMT in FIG. 7.

FIG. 11A is a graph showing the simulated net H3 current at the load resistance 206 as a function of the resistance value (Rg) of the non-linear resistor 204 connected as a gate resistor, as in the circuit of FIG. 7. The simulation that produced the data shown in FIG. 11A assumed a single-gate pHEMT 202 and a fundamental frequency (H1) of 900 MHz. Curve 332 corresponds to a gate-width of the pHEMT of $W_g$=1 mm, curve 334 corresponds to a gate-width of the pHEMT of $W_g$=1.5 mm, and curve 336 corresponds to a gate-width of the pHEMT of $W_g$=2 mm. As shown, the optimal resistance value of the gate resistor 204 increases as the gate-width of the pHEMT 202 increases. Specifically, in this example, for a pHEMT gate-width of 1 mm, the optimal resistance value of the gate resistor 204 is approximately 9 Ohms (as shown in curve 332), whereas when the gate-width increases to 1.5 mm, the optimal resistance value increases to approximately 13 Ohms (as shown in curve 334), and as the gate-width further increases to 2 mm, the optimal resistance value similarly increases to approximately 19 Ohms (as shown in curve 336).

FIG. 11B is a graph showing measurement data corresponding to the conditions of the simulated data presented in FIG. 11A. Specifically, the measurements presented in FIG. 11B were obtained for a single-gate pHEMT connected as shown in FIG. 7 and driven by a 900 MHz tone having a signal power of 32 dBm. Curve 338 corresponds to a gate-width of the pHEMT of $W_g$=1 mm, curve 340 corresponds to a gate-width of $W_g$=1.5 mm, and curve 342 corresponds to a gate-width of $W_g$=2 mm. As shown, the measurement results correspond well with the simulated results presented in FIG. 11A. Specifically, for a gate-width of 1 mm, the measured data indicates an optimal resistance value of about 9 Ohms (point 344 on curve 338), for a gate-width of 1.5 mm, the measured data indicates an optimal resistance value of about 15 Ohms (point 346 on curve 340), and for a gate-width of 2 mm, the measured data indicates an optimal resistance value of about 20 Ohms (point 348 on curve 342).

Figure 12B:
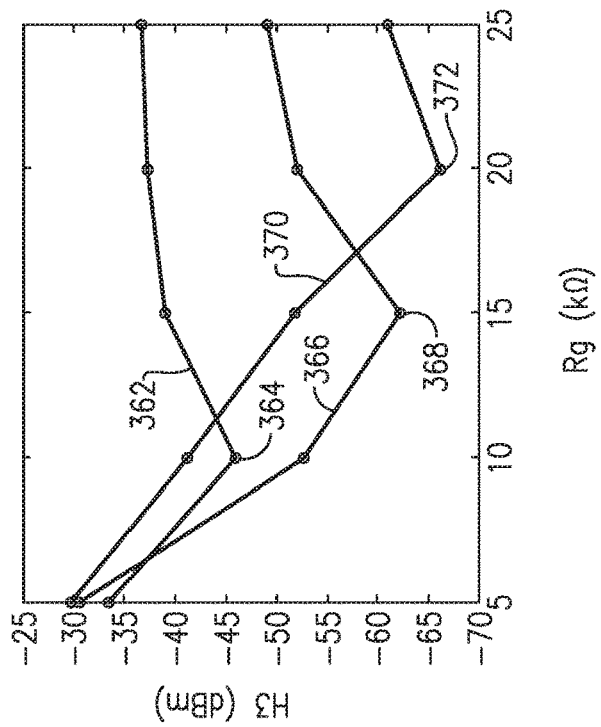
FIG. 12B is a graph of measured net third harmonic signals for varying gate-widths of one example of a triple-gate pHEMT connected as shown in FIG. 7.
Figure 12A:
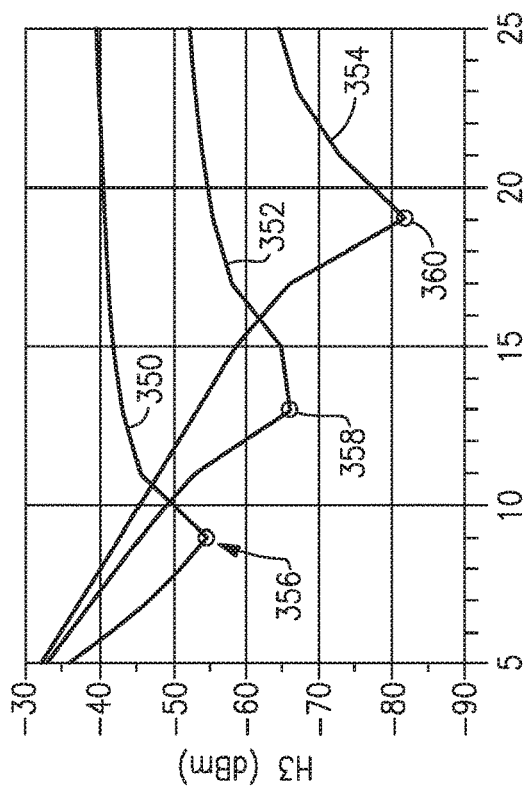
FIG. 12A is a graph of simulated net third harmonic signals at the load in FIG. 7 for varying gate-widths of a triple-gate example of the pHEMT in FIG. 7.

FIGS. 12A and 12B illustrate similar simulated (FIG. 12A) and measured (FIG. 12B) data obtained for a triple-gate pHEMT connected in the same manner as the single-gate pHEMT shown in FIG. 7. Again, the drive signal 402 in both the simulated and measured examples was a 900 MHz tone at 32 dBm. Both the simulated and measured data demonstrate that the optimal resistance value for the gate resistor (Rg) increases with increasing gate-width of the pHEMT 202.

Referring to FIG. 12A, curve 350 corresponds to a pHEMT gate-width of $W_g$=1 mm, curve 352 corresponds to a pHEMT gate-width of $W_g$=1.5 mm, and curve 854 corresponds to a pHEMT gate-width of $W_g$=2 mm. Similar to the single-gate pHEMT example shown in FIG. 11A, the simulations demonstrate that in this example, the optimal gate resistance value increases from about 9 Ohms (point 356 on curve 350) for a 1 mm pHEMT gate-width to about 13 Ohms (point 358 on curve 352), or in a range of about 13-15 Ohms, for a 1.5 mm pHEMT gate-width, to about 19 Ohms (point 360 on curve 354) for a 2 mm pHEMT gate-width.

Referring to FIG. 12B, the measured data correlates well with the simulated data presented in FIG. 12A. Specifically, for a gate-width of 1 mm (curve 862), the measured data indicates an optimal resistance value of about 9 Ohms (point 864 on curve 862), for a gate-width of 1.5 mm (curve 366), the measured data indicates an optimal resistance value of about 15 Ohms (point 368 on curve 366), and for a gate-width of 2 mm (curve 370), the measured data indicates an optimal resistance value of about 20 Ohms (point 372 on curve 370).

The simulated and measured data presented in FIGS. 11A-12B demonstrates that the optimal resistance value (Rg) of the non-linear resistor 204, connected as a gate resistor, for third harmonic (H3) cancellation increases with increasing gate-width of the pHEMT 202, for both single-gate and triple-gate pHEMTs. In addition, the data demonstrates that the optimal resistance value of the gate resistor ($R_{G-opt}$) is roughly proportional to the gate-width ($W_g$) of the pHEMT:

$$R_{G-opt} \propto W_g \quad (22)$$

Accordingly, in certain embodiments, for a switch circuit including pHEMTs of a known gate-width, an optimal resistance value can be selected for the gate resistor, and thereby harmonic cancellation can be achieved as discussed above.

In certain circumstances the gate-widths of one or more pHEMTs used in a switching circuit or amplifier may not be known, or may vary due to process variation in their manufacturing, for example. Additionally, the optimal resistance value of the non-linear resistor 204 may vary with the frequency of the drive signal 214 or 402, even for a given gate-width of the pHEMT 202. Therefore, according to certain embodiments, the non-linear resistor 204 can be implemented as a variable resistance (as shown in FIGS. 16A and 16B) that can be tuned during manufacture of the pHEMT-based circuitry in which it is to be used or during set-up, calibration, or operation of the switching circuitry to dynamically optimize harmonic cancellation.

Figure 13A:
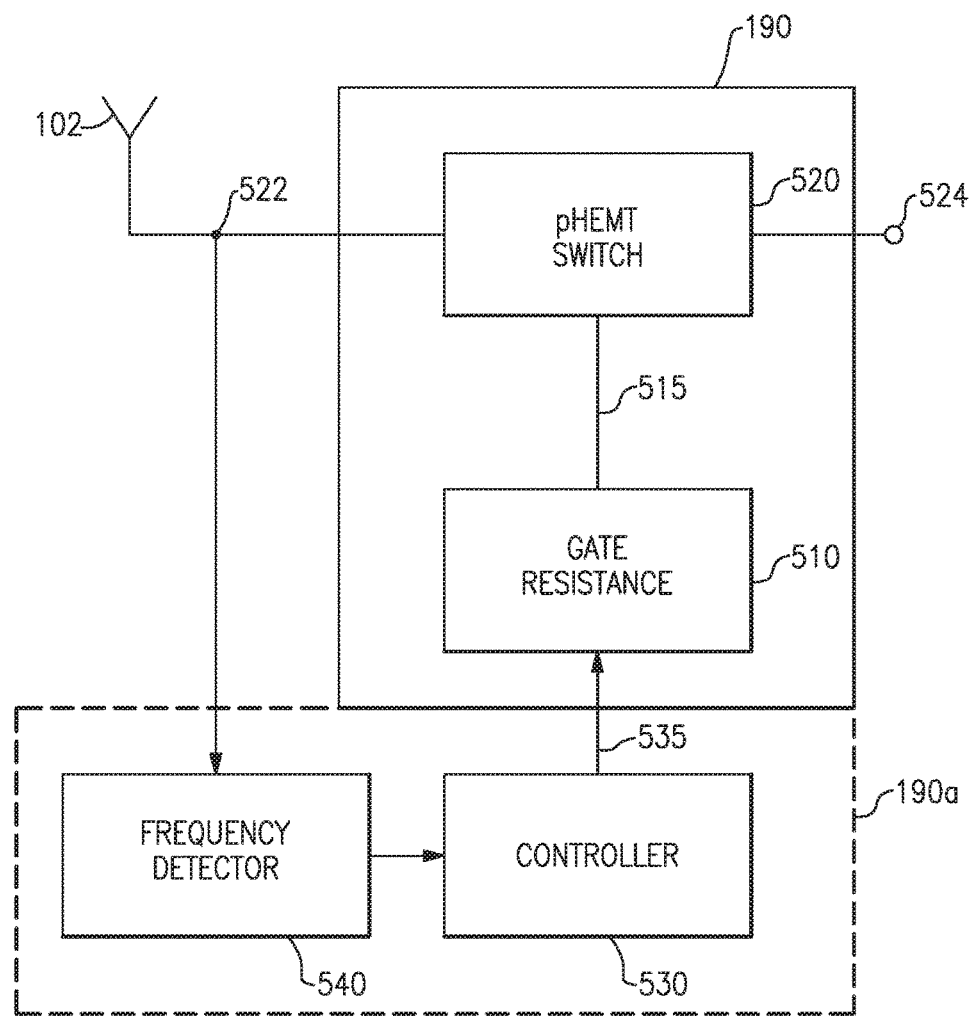
FIG. 13A is a block diagram of one example of a pHEMT-based antenna switch having improved linearity according to aspects of the present invention.

FIG. 13A is a block diagram of one example of the antenna switch 190 including a controllably variable gate resistance circuit 510 to allow the gate resistance (Rg) to be varied in order to optimize harmonic cancellation over several potentially variable conditions, such as different pHEMT gate-widths and different operating frequency bands. In this embodiment, the antenna switch 190 includes pHEMT switching circuitry 520 which can include one or more single-gate or triple-gate pHEMTs. The pHEMT switching circuitry 520 includes a first signal terminal 522 that can be connected to the antenna 102, as shown, and a second signal terminal 524 that can be connected to the phase shifter 104, for example, or directly to the filter circuitry 110. The antenna switch 190 further includes the gate resistance circuit 510 that is connected to the gate(s) of the pHEMT(s) in the pHEMT switching circuitry 520 via gate connection 515. The gate resistance circuit 510 can include one or more variable resistors or a plurality of switchable fixed resistors that can be connected together in various configurations (in series or in parallel) to alter the total resistance value presented at the gate connection 515.

Figure 17:
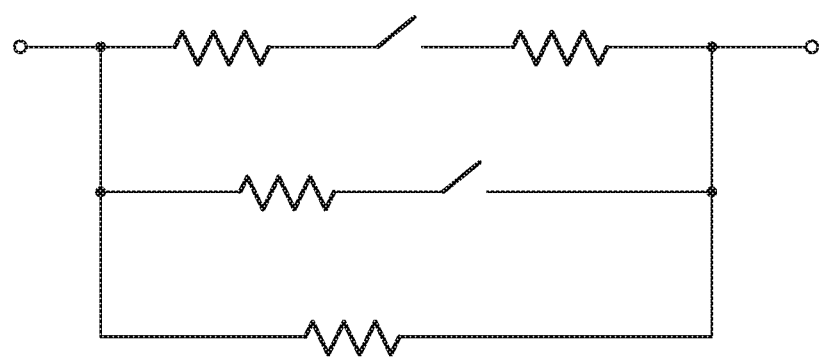
FIG. 17 is a simplified diagram of one example of a configuration of a plurality of switchable resistors.

An example of a configuration of a plurality of switchable resistors that may be used in the gate resistance circuit 510 is shown in FIG. 17.

According to one embodiment, the resistor(s) of the gate resistance circuit 510 can be switchably connected together or varied under the control of a controller 530. Specifically, the controller 530 can provide a control signal 535 to the gate resistance circuit 510, either to activate switches contained therein (not shown) to connect the resistors so as to present a desired resistance value at the gate connection 515, or to vary the resistance values of one or more variable resistors contained in the gate resistance circuit 510, or a combination of both. The controller can be external to the antenna switch 190, or may be part of the antenna switch (as indicated by dotted line 190a). In one embodiment, the controller can receive an input from a frequency detector 540 that is configured to monitor a level of the harmonic signals, in particular, the net H3 current, for example, at the first signal terminal 522, and based on that input, adjust the resistance value presented by the gate resistance circuit 510 to reduce the level of the harmonics. The controller 530, the gate resistance circuit 510 and the frequency detector 540 can provide a feedback loop that monitors and controls the harmonics at a load terminal (e.g., at the signal terminal 522) of the antenna switch 190.

Figure 13B:
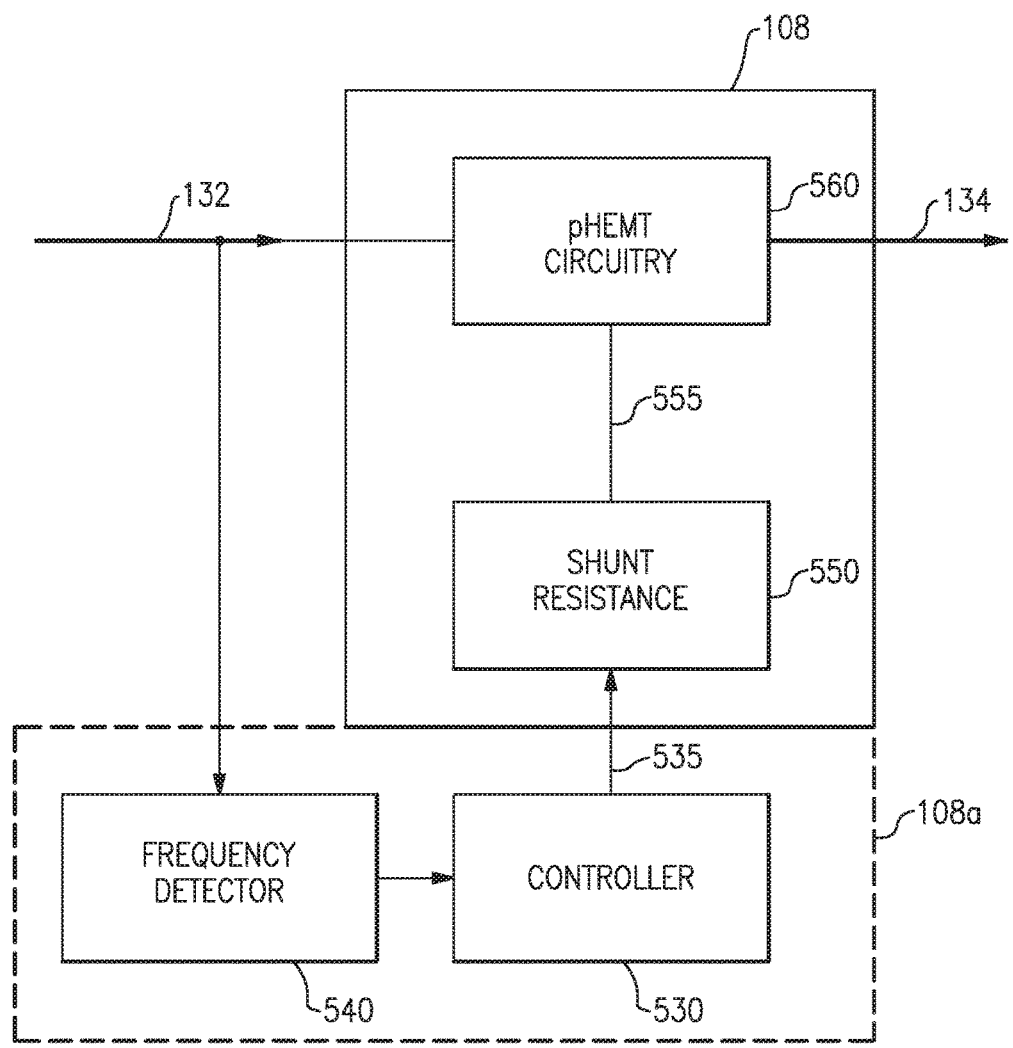
FIG. 13B is a block diagram of one example of a pHEMT-based low noise amplifier having improved linearity according to aspects of the present invention.

Similarly, a controllably variable shunt resistance circuit 550 can be used in the low noise amplifier 108 to allow the shunt resistance to be varied in order to optimize harmonic cancellation over several potentially variable conditions, such as different pHEMT gate-widths and different operating frequency bands. FIG. 13B is a block diagram of one example of the low noise amplifier 108 including the controllably variable shunt resistance circuit 550 and pHEMT circuitry 560, which can include one or more single-gate or triple-gate pHEMTs. The shunt resistance circuit 550 is connected to the pHEMT circuitry 560 via a connection 555. The shunt resistance circuit 550 can include one or more variable resistors or a plurality of switchable fixed resistors that can be connected together in various configurations (in series or in parallel) to alter the total resistance value presented at the connection 555. As discussed above, an example of a switchable resistor configuration is shown in FIG. 17.

According to one embodiment, similar to the example discussed above with respect to FIG. 13A, the resistor(s) of the shunt resistance circuit 550 can be switchably connected together or varied under the control of the controller 530. Specifically, the controller 530 can provide a control signal 535 to the shunt resistance circuit 550, either to activate switches contained therein (not shown) to connect the resistors so as to present a desired resistance value at the connection 555, or to vary the resistance values of one or more variable resistors contained in the shunt resistance circuit 550, or a combination of both. The controller can be external to the antenna switch 108, or may be part of the low noise amplifier module (as indicated by dotted line 108a). As discussed above, in one embodiment, the controller 530 can receive an input from the frequency detector 540 that is configured to monitor a level of the harmonic signals, in particular, the net H3 current, for example, and based on that input, adjust the resistance value presented by the shunt resistance circuit 550 to reduce the level of the harmonics and improve the amplifier linearity.

Thus, aspects and embodiments provide methods and circuit designs to improve linearity in pHEMT-based amplifiers and switches. As discussed above, previous approaches to improving linearity have relied on reducing the level of the harmonics generated in the pHEMT-based circuitry which is both limited in effectiveness and has the associated drawback of requiring increased size of the pHEMTs. In contrast, by using harmonic cancellation techniques as disclosed herein, linearity can be significantly improved through achieving greatly reduced net harmonic signal amplitude at the load, as demonstrated by the results discussed above, while also maintaining smaller device size because the technique does not require any increase in the size of the pHEMTs.

Figure 14:
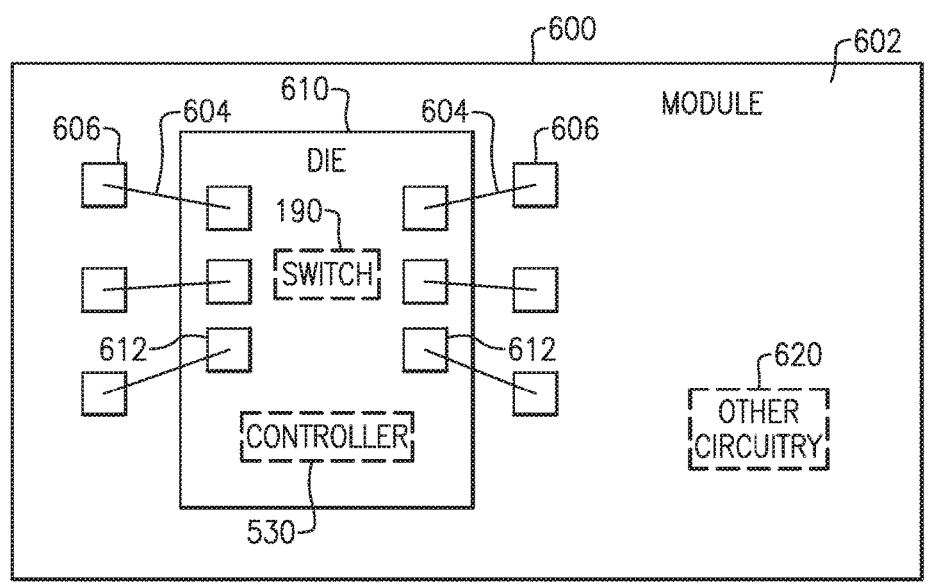
FIG. 14 is a block diagram of one example of a module incorporating a pHEMT-based antenna switch having improved linearity according to aspects of the present invention.

As discussed above, the antenna switch 190 having improved linearity according to aspects and embodiments disclosed herein can be packaged, either alone or together with the filter circuitry 110, as an antenna switch module (ASM) that can be incorporated into a mobile communications device or other electronic device. FIG. 14 is a block diagram of one example of an antenna switch module 600 that can include an embodiment of the antenna switch 190 or 190a. The module 600 includes a packaging substrate 602 that is configured to receive a plurality of components. In some embodiments, such components can include a die 610 having one or more features as described herein. For example, the die 610 can include the antenna switch 190 and optionally other circuitry or components, such as the controller 530, for example. A plurality of connection pads 612 can facilitate electrical connections such as wirebonds 604 to connection pads 606 on the substrate 602 to facilitate passing of various power and signals to and from the die 610. In some embodiments, other circuitry or components 620 can be mounted on or formed on the packaging substrate 602. For example, the components 620 may include the phase shifter 104, optionally the filter circuitry 110, modulators, demodulators, down converters, and the like, as would be known to one of skill in the art of semiconductor fabrication in view of the disclosure herein. In some embodiments, the packaging substrate 602 can include a laminate substrate.

In some embodiments, the module 600 can also include one or more packaging structures to, for example, provide protection and facilitate easier handling of the module 600. Such a packaging structure can include an overmold formed over the packaging substrate 602 and dimensioned to substantially encapsulate the various circuits and components thereon. It will be understood that although the module 600 is described in the context of wirebond-based electrical connections, one or more features of the present disclosure can also be implemented in other packaging configurations, including flip-chip configurations.

Similarly, the low noise amplifier 108 can be packaged as a low noise amplifier module including one or more pHEMT-based amplifiers and associated non-linear resistor(s), as discussed above. The low noise amplifier module can similarly include the controller 530 and optionally the frequency detector 540, as discussed above. Those skilled in the art will appreciate that various other components can be incorporated into the low noise amplifier module, consistent with design and manufacturing practices in the art.

Figure 15:
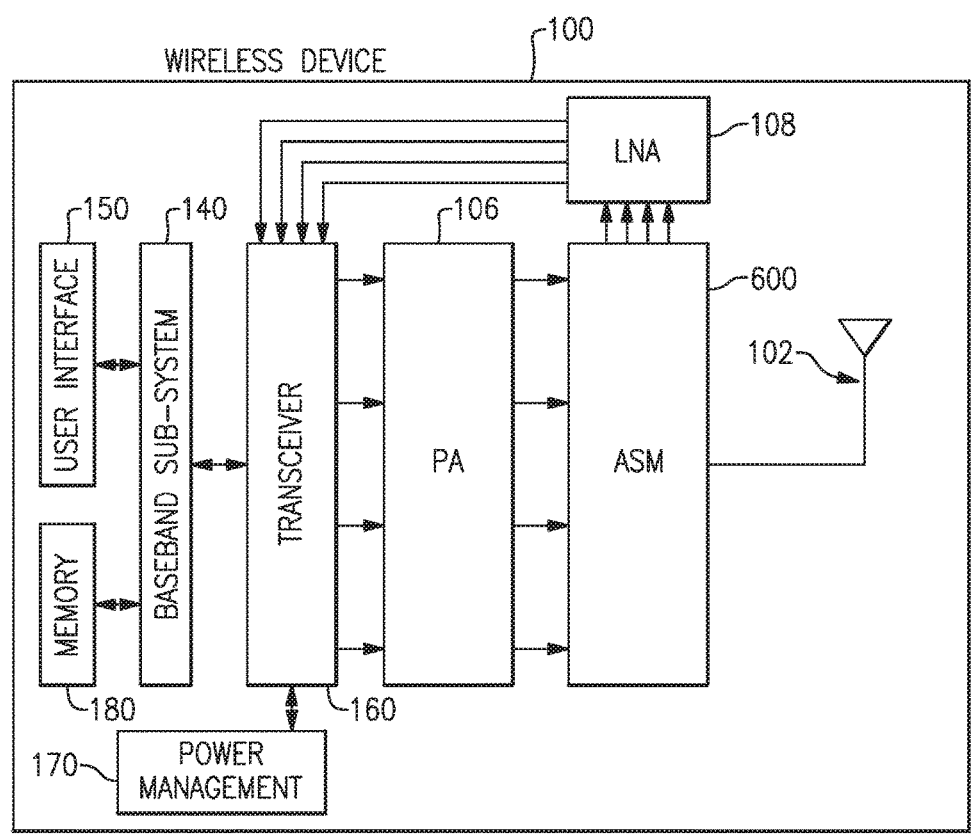
FIG. 15 is a block diagram of one example of a wireless device including a pHEMT-based antenna switch module and pHEMT-based low noise amplifier according to aspects of the present invention.

FIG. 15 is a block diagram of a wireless device including an example of the antenna switch module 600 and low noise amplifier 108, either or both of which can include pHEMT-based circuitry and associated non-linear resistors to improve linearity discussed above. The wireless device 100 can be a cellular phone, smart phone, tablet, modem, or any other portable or non-portable device configured for voice or data communications. As discussed above with reference to FIG. 1, the wireless device 100 includes the antenna 102 coupled to the antenna switch 190. The wireless device 100 can transmit and receive signals from the antenna 102.

The wireless device 100 further includes a transceiver 160. The transceiver may incorporate the transmitter 120 and receiver 130 shown in FIG. 1, for example. The transceiver 160 is configured to generate signals for transmission and/or to process received signals. Signals generated for transmission are received by the power amplifier (PA) 106, which amplifies the generated signals from the transceiver 160. Received signals are amplified by the low noise amplifier (LNA) 108 and then provided to the transceiver 160. The antenna switch module 600 can be configured to switch between different bands and/or modes, transmit and receive modes etc. As is also shown in FIG. 11, the antenna 102 both receives signals that are provided to the transceiver 160 via the antenna switch module 600 and the LNA 108 and also transmits signals from the wireless device 100 via the transceiver 160, the PA 106, and the antenna switch module 600. However, in other examples multiple antennas can be used.

The power amplifier 106 can be used to amplify a wide variety of RF or other frequency-band transmission signals. For example, the power amplifier 106 can receive an enable signal that can be used to pulse the output of the power amplifier to aid in transmitting a wireless local area network (WLAN) signal or any other suitable pulsed signal. The power amplifier 106 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier 106 and associated components including switches and the like can be fabricated on GaAs substrates using, for example, pHEMT or BiFET transistors, or on a Silicon substrate using CMOS transistors.

The wireless device 100 further includes a power management system 170 that is connected to the transceiver 160 and that manages the power for the operation of the wireless device 100. The power management system 160 can also control the operation of the baseband processing circuitry 140 and other components of the wireless device 100. The power management system provides power to the various components of the wireless device 100. Accordingly, in certain examples the power management system 170 may include a battery. Alternatively, the power management system 170 may be coupled to a battery (not shown).

As discussed above with reference to FIG. 1, in certain embodiments the baseband sub-system 140 is connected to a user interface 150 to facilitate various input and output of voice and/or data provided to and received from the user. The baseband sub-system 140 can also be connected to memory 180 that is configured to store data and/or instructions to facilitate the operation of the wireless device 100, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A pseudomorphic high electron mobility transistor circuit comprising:
   at least one pseudomorphic high electron mobility transistor connected between an input signal terminal and a load, the at least one pseudomorphic high electron mobility transistor configured to produce a first harmonic signal at the load responsive to being driven by an input signal of a fundamental frequency received at the input signal terminal, the first harmonic signal having a first phase; and
   at least one non-linear resistor connected to the at least one pseudomorphic high electron mobility transistor and having a resistance value selected to produce a second harmonic signal at the load, the second harmonic signal having a second phase opposite to the first phase.

2. The pseudomorphic high electron mobility transistor circuit of claim 1 wherein the at least one pseudomorphic high electron mobility transistor includes at least one single-gate pseudomorphic high electron mobility transistor.

3. The pseudomorphic high electron mobility transistor circuit of claim 1 wherein the at least one pseudomorphic high electron mobility transistor includes at least one triple-gate pseudomorphic high electron mobility transistor.

4. The pseudomorphic high electron mobility transistor circuit of claim 1 wherein the at least one non-linear resistor includes at least one variable resistor.

5. The pseudomorphic high electron mobility transistor circuit of claim 4 further comprising a controller connected to the at least one variable resistor and configured to tune a resistance of the at least one variable resistor to provide the resistance value to the at least one pseudomorphic high electron mobility transistor, the resistance value being selected such that the second harmonic signal substantially cancels the first harmonic signal at the load.

6. The pseudomorphic high electron mobility transistor circuit of claim 1 wherein the at least one non-linear resistor includes a plurality of switchable resistors configured to be selectively connected together to provide the resistance value to the at least one pseudomorphic high electron mobility transistor.

7. The pseudomorphic high electron mobility transistor circuit of claim 6 further comprising a controller coupled to the plurality of switchable resistors and configured to provide at least one control signal to actuate switches associated with selected ones of the plurality of switchable resistors to connect together the selected ones of the plurality of switchable resistors to provide the resistance value to the at least one pseudomorphic high electron mobility transistor, the resistance value being selected such that the second harmonic signal substantially cancels the first harmonic signal at the load.

8. The pseudomorphic high electron mobility transistor circuit of claim 1 wherein the pseudomorphic high electron mobility transistor circuit is a switching circuit and the at least one non-linear resistor is connected to a gate of the at least one pseudomorphic high electron mobility transistor.

9. The pseudomorphic high electron mobility transistor circuit of claim 8 wherein the at least one non-linear resistor includes at least one variable resistor, the pseudomorphic high electron mobility transistor circuit further comprising a controller connected to the at least one variable resistor and configured to tune a resistance of the at least one variable resistor to provide the resistance value at the gate of the at least one pseudomorphic high electron mobility transistor, the resistance value being selected such that the second harmonic signal substantially cancels the first harmonic signal at the load.

10. The pseudomorphic high electron mobility transistor circuit of claim 9 wherein a net harmonic signal at the load resulting from cancellation of the first harmonic signal by the second harmonic signal has a power level of less than −50 dBm.

11. The pseudomorphic high electron mobility transistor circuit of claim 8 wherein the at least one non-linear resistor includes a plurality of switchable resistors configured to be selectively connected together to provide the resistance value at the gate of the at least one pseudomorphic high electron mobility transistor, the pseudomorphic high electron mobility transistor circuit further comprising a controller coupled to the plurality of switchable resistors and configured to provide at least one control signal to actuate switches associated with selected ones of the plurality of switchable resistors to connect together the selected ones of the plurality of switchable resistors to provide the resistance value at the gate of the at least one pseudomorphic high electron mobility transistor, the resistance value being selected such that the second harmonic signal substantially cancels the first harmonic signal at the load.

12. The pseudomorphic high electron mobility transistor circuit of claim 11 wherein a net harmonic signal at the load resulting from cancellation of the first harmonic signal by the second harmonic signal has a power level of less than −50 dBm.

13. The pseudomorphic high electron mobility transistor circuit of claim 1 wherein the pseudomorphic high electron mobility transistor circuit is an amplifier circuit.

14. A method of improving linearity in a pseudomorphic high electron mobility transistor circuit, the method comprising:
    driving a pseudomorphic high electron mobility transistor in an ON state with an input signal having a fundamental frequency;
    determining a first amplitude and a first phase of a first harmonic signal produced at a load by the pseudomorphic high electron mobility transistor in the ON state; and
    tuning a non-linear resistance connected to the pseudomorphic high electron mobility transistor to produce at the load a second harmonic signal having a second amplitude and a second phase that is opposite to the first phase so as to minimize a net harmonic signal at the load, the net harmonic signal corresponding to a sum of the first harmonic signal and the second harmonic signal, the first and second harmonic signals corresponding to third harmonics of the fundamental frequency.

15. The method of claim 14 further comprising monitoring the net harmonic signal, and providing a control signal to tune the non-linear resistance based on the monitored net harmonic signal.

16. The method of claim 15 wherein tuning the non-linear resistance includes selectively connecting together selected ones of a plurality of switchable resistors.

17. The method of claim 15 wherein tuning the non-linear resistance includes adjusting a resistance of at least one variable resistor connected to the pseudomorphic high electron mobility transistor.

18. A method of improving linearity in a pseudomorphic high electron mobility transistor switch, the method comprising:
    determining a first amplitude and a first phase of a first harmonic signal produced at a load by the pseudomorphic high electron mobility transistor switch in an ON state; and
    tuning a gate resistance connected to a gate of the pseudomorphic high electron mobility transistor switch to produce a second harmonic signal at the load, the second harmonic signal having a second amplitude and a second phase that is opposite to the first phase such that a net harmonic signal at the load corresponding to a sum of the first harmonic signal and the second harmonic signal has a power level of less than −50 dBm.

19. The method of claim 18 wherein tuning the gate resistance includes selectively connecting together selected ones of a plurality of switchable resistors.

20. The method of claim 18 further comprising monitoring the net harmonic signal, wherein tuning the gates resistance includes adjusting a resistance of at least one variable resistor connected to the gate of the pseudomorphic high electron mobility transistor switch to minimize the net harmonic signal.

* * * * *